(12) United States Patent
Fu et al.

(10) Patent No.: US 12,131,051 B2
(45) Date of Patent: Oct. 29, 2024

(54) MIGRATING DATA BETWEEN DIFFERENT MEDIUM LAYERS OF A STORAGE SYSTEM

(71) Applicant: HUAWEI TECHNOLOGIES CO., LTD., Guangdong (CN)

(72) Inventors: Kebo Fu, Hangzhou (CN); Liang Chen, Shenzhen (CN); Ruliang Dong, Hangzhou (CN); Xiang Wu, Chengdu (CN); Xiaodong Luo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 11 days.

(21) Appl. No.: 18/149,288

(22) Filed: Jan. 3, 2023

(65) Prior Publication Data
US 2023/0137007 A1   May 4, 2023

Related U.S. Application Data

(63) Continuation of application No. PCT/CN2020/120835, filed on Oct. 14, 2020.

(30) Foreign Application Priority Data

Jul. 10, 2020 (CN) .......................... 202010661972.0
Aug. 21, 2020 (CN) .......................... 202010851132.0

(51) Int. Cl.
*G06F 3/06* (2006.01)
*H03M 13/35* (2006.01)
*H03M 13/37* (2006.01)

(52) U.S. Cl.
CPC .......... *G06F 3/0652* (2013.01); *G06F 3/0619* (2013.01); *G06F 3/0647* (2013.01);
(Continued)

(58) Field of Classification Search
CPC .... G06F 3/0652; G06F 3/0619; G06F 3/0647; G06F 3/067; G06F 3/0688; G06F 3/0608;
(Continued)

(56) References Cited

U.S. PATENT DOCUMENTS 9,898,224 B1 * 2/2018 Marshak ............... G06F 3/0647
11,144,394 B1 * 10/2021 Wang .................. G06F 11/1004
(Continued)

FOREIGN PATENT DOCUMENTS

| CN | 105487823 A | 4/2016 |
|---|---|---|
| CN | 110531936 A | 12/2019 |
| CN | 111176880 A | 5/2020 |

OTHER PUBLICATIONS

Peter. M Chen, Edward K. Lee, Garth A. Gibson, Randy H. Katz, David A. Patterson, RAID: high-performance, reliable secondary storage, ACM Computing Surveys, vol. 26, No. 2. (Year: 1994).*
(Continued)

*Primary Examiner* — Khoa D Doan
(74) *Attorney, Agent, or Firm* — HUAWEI TECHNOLOGIES CO., LTD.

(57) ABSTRACT

In a data storage method, a storage system comprises first and second medium layers for data storage, wherein the performance of the first medium layer is different from the performance of the second medium layer. Based on the performance difference between the two layers, the storage system stores data in the first medium layer and the second medium layer based on different erasure code ratios. The different erasure code ratios correspond to different write amplification, and result in different storage space utilization.

17 Claims, 10 Drawing Sheets

(52) U.S. Cl.
CPC ............ *G06F 3/067* (2013.01); *H03M 13/35* (2013.01); *H03M 13/373* (2013.01)

(58) Field of Classification Search
CPC .... G06F 3/0616; G06F 3/0689; G06F 3/0614; G06F 3/0656; G06F 11/1076; G06F 11/1004; H03M 13/35; H03M 13/373
See application file for complete search history.

(56) References Cited

U.S. PATENT DOCUMENTS

| | | | |
|---|---|---|---|
| 11,487,715 B1* | 11/2022 | Karr | G06F 3/0655 |
| 2008/0201542 A1* | 8/2008 | Maruyama | G06F 3/0665 |
| | | | 711/E12.002 |
| 2015/0236725 A1* | 8/2015 | Reinart | G06F 3/0619 |
| | | | 714/774 |
| 2015/0378820 A1 | 12/2015 | Doerner | |
| 2016/0211869 A1 | 7/2016 | Blaum et al. | |
| 2017/0228282 A1 | 8/2017 | Gupta et al. | |
| 2020/0042193 A1* | 2/2020 | Dalmatov | G06F 3/0631 |

OTHER PUBLICATIONS

Dell EMC PowerMax et al.,"Family Overview H17118.1",Sep. 2019,total:51 pages.

* cited by examiner

MIGRATING DATA BETWEEN DIFFERENT MEDIUM LAYERS OF A STORAGE SYSTEM

CROSS-REFERENCE TO RELATED APPLICATIONS

This application is a continuation of International Application PCT/CN2020/120835, filed on Oct. 14, 2020, which claims priority to Chinese Patent Application No. 202010661972.0, filed on Jul. 10, 2020, and Chinese Patent Application No. 202010851132.0, filed on Aug. 21, 2020. All of the aforementioned priority patent applications are hereby incorporated by reference in their entirety.

TECHNICAL FIELD

Embodiments of this disclosure relate to the field of data storage technologies, and in particular, to a data storage method, a storage system, a storage device, and a storage medium.

BACKGROUND

In a data storage system, increasing the effective storage capacity of the system is an effective means to reduce storage costs, and an erasure code (EC) technology can be used to improve the effective storage capacity of the storage system. Currently, the EC technology is widely used in multi-level medium storage systems. A multi-level medium storage system includes a plurality of storage media with different performance levels. For example, a storage system may include three storage media: a dynamic random access memory (DRAM), a storage class memory (SCM), and a NAND flash. The DRAM has high performance and low latency, and the performance and latency of the SCM are between the performance and latency of the DRAM and performance and latency of the NAND flash. Usually, the DRAM and the SCM are referred to as high-performance medium layers, and the NAND flash is referred to as a low-performance medium layer. In such a multi-level medium storage system, data are stored at the high-performance medium layer and the low-performance medium layer based on the same erasure code ratio.

SUMMARY

Embodiments of this disclosure provide a data storage method, a storage system, a storage device, and a storage medium, to improve storage space utilization of the storage system. The technical solutions are as follows:

According to a first aspect, a data storage method is provided. The method is applied to a storage system, the storage system includes a first medium layer and a second medium layer, and performance of the first medium layer is different from performance of the second medium layer. The method includes: storing data at the first medium layer based on a first erasure code ratio; and when a specified condition is met, migrating the data stored at the first medium layer to the second medium layer based on a second erasure code ratio, where the first erasure code ratio corresponds to N data units and M check units, and N and M are integers greater than or equal to 1; the second erasure code ratio corresponds to X data units and Y check units, and X and Y are integers greater than or equal to 1; and a ratio of N to M is not equal to a ratio of X to Y. N is not equal to X, and M may or may not be equal to Y.

The performance of the first medium layer is different from the performance of the second medium layer. In one case, the performance of the first medium layer is higher than the performance of the second medium layer. In this case, the data is stored at the first medium layer based on the first erasure code ratio. When the specified condition is met, the data stored at the first medium layer is migrated to the second medium layer based on the second erasure code ratio. The first medium layer may be a storage medium used as a memory, such as a DRAM or an SCM, and the second medium layer may be a persistent storage medium such as a solid state disk or a mechanical hard disk. In another case, in some application scenarios, data stored in a low-performance storage medium needs to be restored to a high-performance storage medium. Correspondingly, an erasure code ratio also changes with data migration, to match performance of the storage medium. For example, when the performance of the first medium layer is lower than the performance of the second medium layer, the data is stored at the first medium layer based on the first erasure code ratio, and the data stored at the first medium layer is migrated to the second medium layer based on the second erasure code ratio. This process is a data reading process. To be specific, to-be-read data is stored at the first medium layer based on the first erasure code ratio. After the specified condition is met, the data stored at the first medium layer is read into the second medium layer, and the data is stored at the second medium layer based on the second erasure code ratio. Then, the data that is read into the second medium layer is fed back to a user.

The performance of the medium layer is represented by parameters such as a read/write speed and a latency of the medium layer.

In an implementation, the performance of the first medium layer is higher than the performance of the second medium layer, and the ratio of N to M is less than the ratio of X to Y. Herein, N is less than X. To be specific, data is stored at a high-performance medium layer based on a low erasure code ratio, and data is stored at a low-performance medium layer based on a high erasure code ratio. Because an input/output (I/O) granularity received at the high-performance medium layer is small, the data is stored based on the low erasure code ratio, so that a full stripe is easily completed, write amplification is reduced, and storage space utilization is improved. In addition, the data is stored at the low-performance medium layer based on the high erasure code ratio, so that a proportion of redundant data in storage space can be reduced, to improve storage space utilization.

In an implementation, the data stored at the first medium layer includes a plurality of pieces of subdata, each subdata corresponds to one first check matrix, and each first check matrix includes the N data units and the M check units. Therefore, in this implementation, a specific data storage manner is provided. The check matrix is a set of all data units and check units included in one stripe, the matrix includes a plurality of elements, and each element is one data unit or one check unit. In this embodiment, the first check matrix is a matrix corresponding to data stored at the first medium layer, and a second check matrix is a matrix corresponding to data stored at the second medium layer. For example, the first medium layer stores four pieces of subdata, each piece of subdata corresponds to one first check matrix, and each first check matrix includes six data units and two check units.

In an implementation, an implementation process of migrating the data stored at the first medium layer to the second medium layer based on a second erasure code ratio is: obtaining the X data units based on the N data units included in each first check matrix, where X is an integer multiple of N; obtaining the Y check units through calculation to generate a second check matrix, where the second check matrix includes the X data units and the Y check units; and writing the second check matrix to the second medium layer. For example, the second medium layer stores one or more second check matrices, and one second check matrix is from four first check matrices at the first medium layer. Specifically, the second check matrix includes 24 data units (that is, X=24) and two check units (that is, Y=2). The 24 data units are directly from the six data units in each first check matrix.

In this embodiment of this disclosure, the data stored at the first medium layer based on the first erasure code ratio can be directly combined to form data that meets the second erasure code ratio, and stored at the second medium layer, that is, the data may be combined or split between different medium layers, so that computing resources of the storage system are saved.

In an implementation, the obtaining the Y check units through calculation includes: obtaining the Y check units through calculation based on the X data units. In this calculation manner, the Y check units are obtained through calculation based on the X data units. In this case, a quantity of check units in the second check matrix is flexible, and is not limited to the quantity (M) of check units in the first check matrix described above. In other words, Y may or may not be equal to M.

In an implementation, the obtaining the Y check units through calculation includes: calculating the Y check units based on the M check units included in each first check matrix, where Y is equal to M. In this calculation manner, the check units in the second check matrix are generated based on the check units included in the first check matrix. Compared with calculating the Y check units based on the X data units, this manner can reduce a calculation amount. For example, the Y check units in the second check matrix may be obtained by using a simple exclusive OR operation based on the M check units in each first check matrix. Therefore, a calculation amount is small. In this calculation manner, a value of Y is equal to a value of M in most cases, but Y is not equal to M in some scenarios.

In an implementation, the M check units in each first check matrix are stored in a first storage node in the storage system; and the method further includes: obtaining the M check units in each first check matrix from the first storage node. The M check units in each first check matrix are stored in the first storage node. Therefore, when the Y check units in the second check matrix are calculated based on the M check units in each first check matrix, check units in all first check matrices can be directly obtained from the first storage node. Compared with storing the check units in all the first check matrices in a distributed manner, this manner can effectively reduce a quantity of network communication times, and save bandwidth resources. The first storage node is any storage node included in the storage system.

In an implementation, when M is greater than or equal to 2, the M check units include a check unit p and a check unit q, where the check unit p in each first check matrix is stored in a first storage node in the storage system, and the check unit q in each first check matrix is stored in a second storage node in the storage system. The method further includes: obtaining the check unit p in each first check matrix from the first storage node; and obtaining the check unit q in each first check matrix from the second storage node. The calculating the Y check units based on the M check units included in each first check matrix specifically includes: obtaining the Y check units through calculation based on the check unit p in each first check matrix and the check unit q in each first check matrix, where the Y check units include a check unit p' and a check unit q' in the check matrix.

The check unit p in the M check units in each first check matrix is stored in the first storage node, and the check unit q in the M check units in each first check matrix is stored in the second storage node. In this way, when the check unit p' in the Y check units in the second check matrix is calculated based on the check unit p in the M check units in each first check matrix, check units p in all the first check matrices can be directly obtained from the first storage node. Similarly, when the check unit q' in the Y check units in the second check matrix is calculated based on the check unit q in the M check units in each first check matrix, check units q in all the first check matrices can be directly obtained from the second storage node. Compared with storing the check units p and the check units q in all the first check matrices in a distributed manner, this manner can effectively reduce a quantity of network communication times, and save bandwidth resources.

In an implementation, the first erasure code ratio or the second erasure code ratio is determined based on a topology structure of the storage system and a fault tolerance capability of the storage system, where the topology structure is used to indicate a quantity of storage nodes included in the storage system, and the fault tolerance capability is used to indicate a quantity of storage nodes whose faults are tolerant in the storage system.

Both the first erasure code ratio and the second erasure code ratio may be determined based on the topology structure and the fault tolerance capability of the storage system, the first erasure code ratio may be determined based on the topology structure and the fault tolerance capability of the storage system, and the second erasure code ratio may be obtained based on the first erasure code ratio, or the second erasure code ratio may be determined based on the topology structure and the fault tolerance capability of the storage system, and the first erasure code ratio may be obtained based on the second erasure code ratio. This is not limited in this embodiment of this disclosure. In addition, the quantity of storage nodes whose faults are tolerant in the storage system is equal to a quantity of check units corresponding to the first erasure code ratio, or a quantity of check units corresponding to the second erasure code ratio.

For example, in this embodiment of this disclosure, a management node obtains the topology structure and the fault tolerance capability of the storage system, and then determines, by using a formula N≤(k×M)−M, a value range of a quantity of data units corresponding to the first erasure code ratio. Herein, N is the quantity of data units corresponding to the first erasure code ratio. k is a quantity of nodes included in the storage system. When a security level is server-level security, the node is a server. When the security level is cabinet-level security, the node is a cabinet. M is the quantity that is of nodes whose faults can be tolerant in the storage system and that is indicated by the fault tolerance capability, that is, the quantity of check units corresponding to the first erasure code ratio. It should be noted that M may be a default value, or may be a user-defined value, and M is an integer greater than or equal to 1, for example, M=2. After determining the value range of the quantity of data units corresponding to the first erasure code ratio, the management node determines a plurality of first candidate erasure code ratios based on the value range and M, where each candidate erasure code ratio corresponds to one value in the value range. Then, the management node selects a corresponding erasure code ratio with a smallest write amplification value from the plurality of first candidate erasure code ratios as the first erasure code ratio.

It should be noted that write amplification means that an amount of data actually written by a storage node is greater than an amount of data received from a computing node. For any first candidate erasure code ratio, a write amplification value corresponding to the first candidate erasure code ratio is equal to a ratio of a total quantity of data units and check units corresponding to the first candidate erasure code ratio to a quantity of data units. For example, for an erasure code ratio 6:2, a write amplification value corresponding to the erasure code ratio is (6+2)/6.

Alternatively, in this embodiment of this disclosure, the management node may obtain the topology structure and the fault tolerance capability of the storage system, then determine, by using a formula $X \leq (i \times Y) - Y$, a value range of a quantity of data units corresponding to the second erasure code ratio, and determine the second erasure code ratio based on the value range of the quantity of data units and Y. Herein, X is the quantity of data units corresponding to the second erasure code ratio, and X is greater than N. i is a quantity of subnodes in a node included in the storage system. When a security level is server-level security, i is a quantity of subnodes in a server included in the storage system, where the subnode in the server may be a physical hard disk or a disk logical domain connected to the server. When the security level is cabinet-level security, i is a quantity of subnodes in a cabinet included in the storage system, where the subnode in the cabinet is a server included in the cabinet. Y is the quantity that is of nodes whose faults can be tolerant in the storage system and that is indicated by the fault tolerance capability, that is, Y is a quantity of check units corresponding to the second erasure code ratio. It should be noted that Y may be a default value, or may be a user-defined value, and Y is greater than or equal to 1, for example, Y=2. In addition, Y may or may not be equal to M. This is not limited in this embodiment of this disclosure.

It should be noted that the security level described above may be obtained by the management node after being configured by a user, or may be determined by the management node based on the topology structure of the storage system according to a preset principle, where the preset principle is a calculation principle that can ensure reliability of the storage system. This is not limited in this embodiment of this disclosure. The security level includes server-level security, cabinet-level security, and the like. The server-level security is used to indicate that the storage system can tolerate faults that occur on a maximum oft servers. The cabinet-level security is used to indicate that the storage system can tolerate faults that occur on a maximum oft cabinets.

In an implementation, the specified condition includes: an available capacity of the first medium layer reaches a capacity threshold. Assuming that the performance of the first medium layer is higher than the performance of the second medium layer, a capacity of the first medium layer is usually less than a capacity of the second medium layer, and the first medium layer is also more valuable than the second medium layer because a read/write speed of the data stored at the first medium layer is faster and a latency is lower. Therefore, when the available capacity of the first medium layer reaches the capacity threshold, the data at the first medium layer is migrated to the second medium layer, so that the first medium layer makes space for processing more data. Migrating to the second medium layer means that the data is copied to the second medium layer without requiring whether the data originally stored at the first medium layer is immediately deleted.

In an implementation, the specified condition includes: an access frequency of the data stored at the first medium layer is less than a popularity threshold. It is further assumed that the performance of the first medium layer is higher than the performance of the second medium layer. In this implementation, data with a high access frequency may continue to be retained at the first medium layer, and data with a low access frequency may be migrated to the second medium layer, so that storage space of a high-performance storage medium is saved, and read/write performance of the data with a high access frequency is also improved.

According to a second aspect, a storage system is provided. The storage system includes a first medium layer and a second medium layer, and performance of the first medium layer is different from performance of the second medium layer. Data is stored at the first medium layer based on a first erasure code ratio; and when a specified condition is met, the data at the first medium layer is migrated to the second medium layer based on a second erasure code ratio. The first erasure code ratio corresponds to N data units and M check units, and N and M are integers greater than or equal to 1; the second erasure code ratio corresponds to X data units and Y check units, and X and Y are integers greater than or equal to 1; a ratio of N to M is not equal to a ratio of X to Y; and N is not equal to X, and M may or may not be equal to Y.

The storage system according to the second aspect may be a distributed storage system, or may be a centralized storage system. The distributed storage system is used as an example. The storage system includes a plurality of storage nodes. Each storage node includes a memory and a hard disk. The memory is the first medium layer, for example, a DRAM and/or an SCM, and the hard disk is the second medium layer, for example, a solid state disk or a mechanical hard disk. In some implementations, a solid state disk may alternatively serve as the memory. In this case, the second medium layer is a mechanical hard disk or another storage medium with lower performance. For example, the memory included in each storage node is used as the first medium layer, the hard disk included in each storage node is used as the second medium layer, and the performance of the first medium layer is higher than the performance of the second medium layer. Any one of the plurality of storage nodes may receive data sent by a host or a client. A first storage node is used as an example. The data is temporarily stored in a memory of the first storage node. When an amount of data in the memory of the first storage node is an amount of data included in data units included in a first check matrix, the first storage node divides the data into N data units based on the first erasure code ratio, calculates M check units based on the N data units, and then stores the N data units and the M check units in each storage node (which may include the first storage node) in the storage system in a distributed manner. Similarly, the first storage node continues receiving the data sent by the client. When an amount of data in the memory of the first storage node is the amount of data included in the data units included in the first check matrix, the first storage node continues storing, in each storage node in a distributed manner, the N data units and the M units corresponding to the data. When the specified condition is met, each storage node may migrate the data in the memory of each storage node to the hard disk. This means that data units included in the memory of each storage node are all migrated to the hard disk. The first storage node may obtain, based on the second erasure code ratio, Y check units corresponding to the data units (for example, X data units), and write the Y check units to the hard disk (which may be a local hard disk of the first storage node or a hard disk of another storage node). In this way, the data is stored at the second medium layer based on the second erasure code ratio.

In some implementations, the Y check units may be obtained through calculation based on the X data units. In some other implementations, the Y check units may be obtained through calculation based on M check units in a plurality of first check matrices.

In an implementation, the performance of the first medium layer is higher than the performance of the second medium layer, and the ratio of N to M is less than the ratio of X to Y. Herein, N is less than X. To be specific, data is stored at a high-performance medium layer based on a low erasure code ratio, and data is stored at a low-performance medium layer based on a high erasure code ratio. Because an input/output (I/O) granularity received at the high-performance medium layer is small, the data is stored based on the low erasure code ratio, so that a full stripe is easily completed, write amplification is reduced, and storage space utilization is improved. In addition, the data is stored at the low-performance medium layer based on the high erasure code ratio, so that a proportion of redundant data in storage space can be reduced, to improve storage space utilization.

In an implementation, the data stored at the first medium layer includes a plurality of pieces of subdata, each subdata corresponds to one first check matrix, and each first check matrix includes the N data units and the M check units. To be specific, in this implementation, the check matrix is a set of all data units and check units included in one stripe, the matrix includes a plurality of elements, and each element is one data unit or one check unit. In this embodiment, the first check matrix is a matrix corresponding to data stored at the first medium layer, and a second check matrix is a matrix corresponding to data stored at the second medium layer. For example, the first medium layer stores four pieces of subdata, each piece of subdata corresponds to one first check matrix, and each first check matrix includes six data units and two check units.

In an implementation, the data at the second medium layer corresponds to a second check matrix, and the second check matrix includes the X data units and the Y check units, where the X data units are from the N data units included in each first check matrix, and X is an integer multiple of N. Specifically, for example, the first medium layer is a memory of each storage node, and the second medium layer is a hard disk of each storage node. Data units and check units in a plurality of first check matrices are stored in the memory of each storage node in the storage system in a distributed manner. After the specified condition is met, each storage node stores, in the hard disk of the storage node, the data units included in the first check matrix that are stored in the memory of the storage node, and the data units form the X data units in the second check matrix. In addition, a storage node in the plurality of storage nodes may further generate the Y check units based on the check units in the first check matrix, and store the Y check units in a hard disk of the storage node. In this way, the data stored at the first medium layer is stored at the second medium layer based on the second erasure code ratio.

In this embodiment of this disclosure, the data stored at the first medium layer based on the first erasure code ratio can be directly combined to form data that meets the second erasure code ratio, and stored at the second medium layer, that is, the data may be combined or split between different medium layers, so that computing resources of the storage system are saved.

In an implementation, the Y check units are obtained through calculation based on the X data units. A first storage node in the storage system is used as an example. The first storage node obtains X data units, and obtains corresponding Y check units through calculation based on the X data units. In this case, a quantity of check units obtained through calculation is flexible, that is, Y may or may not be equal to a quantity M of check units in the first check matrix.

In an implementation, the Y check units are obtained through calculation based on the M check units included in each first check matrix, and Y is equal to M. Specifically, the first storage node is still used as an example. The first storage node obtains the M check units included in each first check matrix, and obtains the Y check units through calculation by using a simple exclusive OR operation based on the obtained check units included in the first check matrix. In this way, compared with calculating the Y check units based on the X data units, this manner can reduce a calculation amount. In addition, in this implementation, a value of Y is equal to a value of M in most cases, but Y is not equal to M in some scenarios.

In an implementation, the M check units in each first check matrix are stored in a first storage node in the storage system, and the first storage node is configured to: obtain the M check units in each first check matrix, and obtain the Y check units through calculation based on the M check units included in each first check matrix.

The M check units in each first check matrix are stored in the first storage node. Therefore, when the Y check units in the second check matrix are calculated based on the M check units in each first check matrix, check units in all first check matrices can be directly obtained from the first storage node. Compared with storing the check units in all the first check matrices in a distributed manner, this manner can effectively reduce a quantity of network communication times, and save bandwidth resources.

In an implementation, the first erasure code ratio or the second erasure code ratio is determined based on a topology structure of the storage system and a fault tolerance capability of the storage system, where the topology structure is used to indicate a quantity of storage nodes included in the storage system, and the fault tolerance capability is used to indicate a quantity of storage nodes whose faults are tolerant in the storage system.

In the distributed storage system, a management node may determine the first erasure code ratio or the second erasure code ratio based on the topology structure and the fault tolerance capability of the storage system. The management node may be any one of the plurality of storage nodes in the storage system, or the management node is a node that is in the storage system, that is independent of the storage node, and that is configured to manage each storage node. In this embodiment, the management node may obtain the first erasure code ratio and the second erasure code ratio during initialization, or may obtain the first erasure code ratio and the second erasure code ratio in a running process of the storage system. Both the first erasure code ratio and the second erasure code ratio may be determined based on the topology structure and the fault tolerance capability of the storage system, the first erasure code ratio may be determined based on the topology structure and the fault tolerance capability of the storage system, and the second erasure code ratio may be obtained based on the first erasure code ratio, or the second erasure code ratio may be determined based on the topology structure and the fault tolerance capability of the storage system, and the first erasure code ratio may be obtained based on the second erasure code ratio. This is not limited in this embodiment of this disclosure. In addition, the quantity of storage nodes whose faults are tolerant in the storage system is equal to a quantity of check units corresponding to the first erasure code ratio, or a quantity of check units corresponding to the second erasure code ratio.

For example, the management node obtains the topology structure and the fault tolerance capability of the storage system, and then determines, by using a formula $N \leq (k \times M) - M$, a value range of a quantity of data units corresponding to the first erasure code ratio. Herein, N is the quantity of data units corresponding to the first erasure code ratio. k is a quantity of nodes included in the storage system. When a security level is server-level security, the node is a server. When the security level is cabinet-level security, the node is a cabinet. M is the quantity that is of nodes whose faults can be tolerant in the storage system and that is indicated by the fault tolerance capability, that is, the quantity of check units corresponding to the first erasure code ratio. It should be noted that M may be a default value, or may be a user-defined value, and M is an integer greater than or equal to 1, for example, M=2. After determining the value range of the quantity of data units corresponding to the first erasure code ratio, the management node determines a plurality of first candidate erasure code ratios based on the value range and M, where each candidate erasure code ratio corresponds to one value in the value range. Then, the management node selects a corresponding erasure code ratio with a smallest write amplification value from the plurality of first candidate erasure code ratios as the first erasure code ratio.

It should be noted that write amplification means that an amount of data actually written by a storage node is greater than an amount of data received from a computing node. For any first candidate erasure code ratio, a write amplification value corresponding to the first candidate erasure code ratio is equal to a ratio of a total quantity of data units and check units corresponding to the first candidate erasure code ratio to a quantity of data units. For example, for an erasure code ratio 6:2, a write amplification value corresponding to the erasure code ratio is (6+2)/6.

Alternatively, the management node obtains the topology structure and the fault tolerance capability of the storage system, then determines, by using a formula $X \leq (i \times Y) - Y$, a value range of a quantity of data units corresponding to the second erasure code ratio, and determines the second erasure code ratio based on the value range of the quantity of data units and Y. Herein, X is the quantity of data units corresponding to the second erasure code ratio, and X is greater than N. i is a quantity of subnodes in a node included in the storage system. When a security level is server-level security, i is a quantity of subnodes in a server included in the storage system, where the subnode in the server may be a physical hard disk or a disk logical domain connected to the server. When the security level is cabinet-level security, i is a quantity of subnodes in a cabinet included in the storage system, where the subnode in the cabinet is a server included in the cabinet. Y is the quantity that is of nodes whose faults can be tolerant in the storage system and that is indicated by the fault tolerance capability, that is, Y is a quantity of check units corresponding to the second erasure code ratio. It should be noted that Y may be a default value, or may be a user-defined value, and Y is greater than or equal to 1, for example, Y=2. In addition, Y may or may not be equal to M. This is not limited in this embodiment of this disclosure.

It should be noted that the security level described above may be obtained by the management node after being configured by a user, or may be determined by the management node based on the topology structure of the storage system according to a preset principle, where the preset principle is a calculation principle that can ensure reliability of the storage system. This is not limited in this embodiment of this disclosure. The security level includes server-level security, cabinet-level security, and the like. The server-level security is used to indicate that the storage system can tolerate faults that occur on a maximum oft servers. The cabinet-level security is used to indicate that the storage system can tolerate faults that occur on a maximum oft cabinets.

In an implementation, the specified condition includes: an available capacity of the first medium layer reaches a capacity threshold.

In an implementation, the specified condition includes: an access frequency of the data stored at the first medium layer is less than a popularity threshold.

In addition, the storage system according to the second aspect may alternatively be a centralized storage system, for example, a storage array or another storage device. The storage array is used as an example. The storage array includes one or more controllers, and each controller is coupled to a disk enclosure. A memory of each controller forms the first medium layer, and a hard disk of the disk enclosure forms the second medium layer. Any controller may receive data sent by a host or a client. A first controller is used as an example. The data is temporarily stored in a memory of the first controller. When an amount of data in the memory of the first controller is an amount of data included in data units included in a first check matrix, the first controller divides the data into N data units based on the first erasure code ratio, calculates M check units based on the N data units, and then stores the N data units and the M check units in each controller (which may include the first controller) in the storage system in a distributed manner. Similarly, the first controller continues receiving the data sent by the host. When an amount of data in the memory of the first controller is the amount of data included in the data units included in the first check matrix, the first controller continues storing, in each controller in a distributed manner, the N data units and the M units corresponding to the data. When the specified condition is met, each controller may migrate the data in the memory of each controller to the hard disk. This means that data units included in the memory of each controller are all migrated to the hard disk. The first controller may obtain, based on the second erasure code ratio, Y check units corresponding to the data units (for example, X data units), and write the check units to the hard disk. In this way, the data is stored at the second medium layer based on the second erasure code ratio.

According to a third aspect, a storage device is provided. The storage device may be a storage node in the distributed storage system according to the second aspect, may be an independent server, or may be a device that has both a storage capability and a computing capability, such as a disk enclosure. The storage device includes a first medium layer, a second medium layer, and a processor. The processor is configured to: receive data; store the data at the first medium layer based on a first erasure code ratio; and when a specified condition is met, obtain the data from the first medium layer, and migrate the data to the second medium layer based on a second erasure code ratio, where the first erasure code ratio corresponds to N data units and M check units, and N and M are integers greater than or equal to 1; the second erasure code ratio corresponds to X data units and Y check units, and X and Y are integers greater than or equal to 1; a ratio of N to M is not equal to a ratio of X to Y; and N is not equal to X, and M may or may not be equal to Y.

In an implementation, performance of the first medium layer is higher than performance of the second medium layer, and the ratio of N to M is less than the ratio of X to Y.

In an implementation, the data stored at the first medium layer includes a plurality of pieces of subdata, each subdata corresponds to one first check matrix, and each first check matrix includes the N data units and the M check units.

In an implementation, that the data is migrated to the second medium layer based on a second erasure code ratio includes: obtaining the X data units based on the N data units included in each first check matrix, where X is an integer multiple of N; obtaining the Y check units through calculation to generate a second check matrix, where the second check matrix includes the X data units and the Y check units; and writing the second check matrix to the second medium layer.

In an implementation, that the Y check units are obtained through calculation includes: obtaining the Y check units through calculation based on the X data units.

In an implementation, that the Y check units are obtained through calculation includes: calculating the Y check units based on the M check units included in each first check matrix, where Y is equal to M.

In an implementation, the specified condition includes: an available capacity of the first medium layer reaches a capacity threshold.

In an implementation, the specified condition includes: an access frequency of the data stored at the first medium layer is less than a popularity threshold.

According to a fourth aspect, a computer-readable storage medium is provided. The computer-readable storage medium stores instructions, and when the instructions are run on a computer, the computer is enabled to perform the data storage method according to the first aspect.

According to a fifth aspect, a computer program product including instructions is provided. When the computer program product runs on a computer, the computer is enabled to perform the data storage method according to the first aspect.

According to a sixth aspect, a data processing apparatus is provided. The data processing apparatus is located in the foregoing storage device, the storage device includes a first medium layer, a second medium layer, and a processor, and performance of the first medium layer is different from performance of the second medium layer. The apparatus includes a storage module 1101 and a migration module 1102. The storage module 1101 is configured to: receive data, and store the data at the first medium layer based on a first erasure code ratio. The migration module 1102 is configured to: when a specified condition is met, obtain the data from the first medium layer, and migrate the data to the second medium layer based on a second erasure code ratio, where the first erasure code ratio corresponds to N data units and M check units, and N and M are integers greater than or equal to 1; the second erasure code ratio corresponds to X data units and Y check units, and X and Y are integers greater than or equal to 1; and a ratio of N to M is not equal to a ratio of X to Y. For other functions of the apparatus, refer to the descriptions of the third aspect.

Technical effects achieved in the second aspect, the third aspect, the fourth aspect, the fifth aspect, and the sixth aspect are similar to technical effects achieved by using corresponding technical means in the first aspect. Details are not described herein again.

DESCRIPTION OF EMBODIMENTS

To make objectives, technical solutions, and advantages of the embodiments of this disclosure clearer, the following further describes implementations of this disclosure in detail with reference to the accompanying drawings.

Before the embodiments of this disclosure are described in detail, a system architecture in the embodiments of this disclosure is described first.

Figure 1:
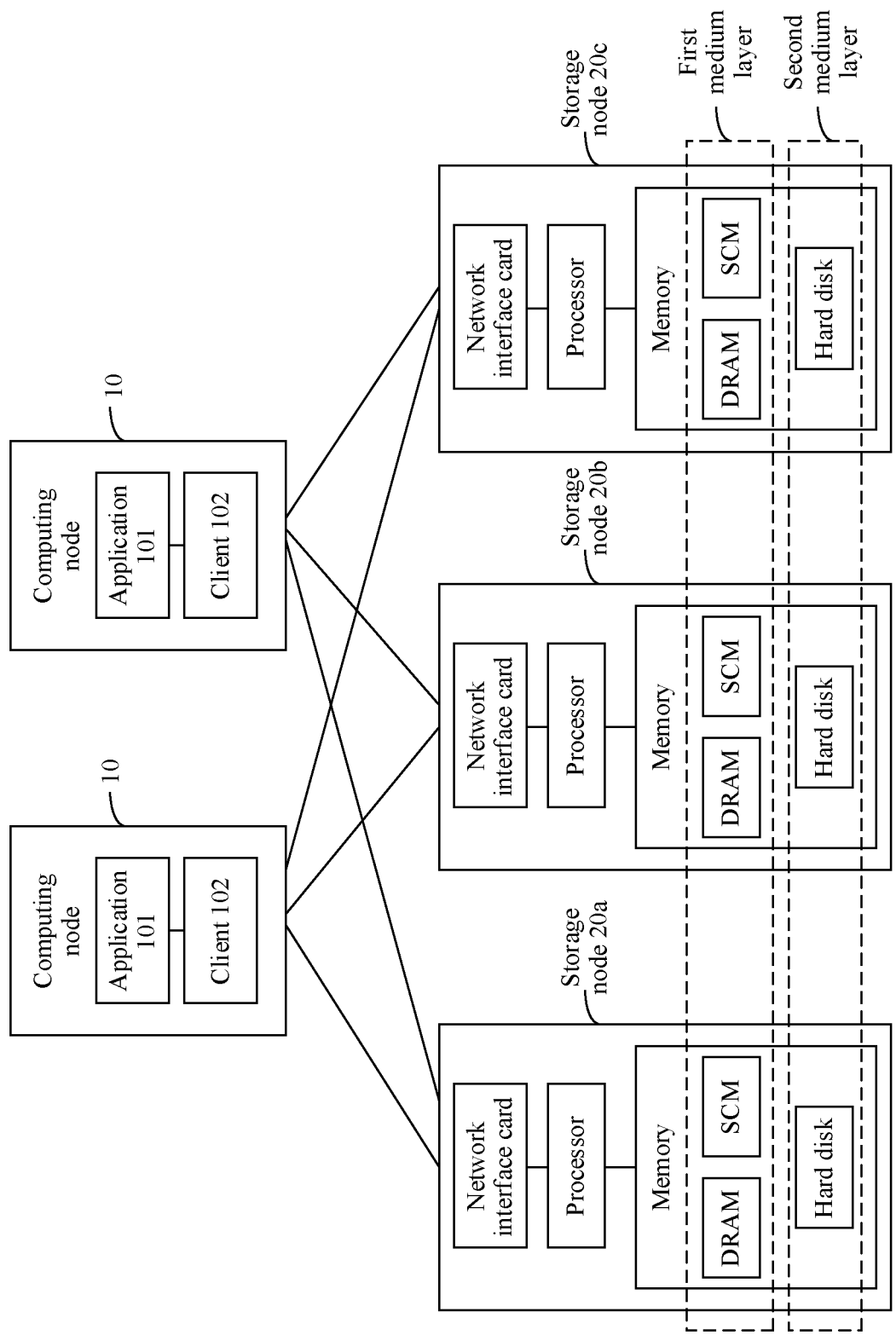
FIG. 1 is a diagram of an architecture of a storage system according to an embodiment of this disclosure.

FIG. 1 is a schematic diagram of a structure of a storage system according to an embodiment of this disclosure. As shown in FIG. 1, the storage system includes a computing node cluster and a storage node cluster. The computing node cluster includes one or more computing nodes 10 (FIG. 1 shows two computing nodes 10, but there are not limited to the two computing nodes 10). The computing node 10 is a computing device on a user side, for example, a server or a desktop computer. At a hardware layer, a processor and a memory (not shown in FIG. 1) are disposed in the computing node 10. At a software layer, an application program (application for short) 101 and a client program (client for short) 102 are run on the computing node 10. The application 101 is a general term of various application programs presented to a user. The client 102 is configured to: receive a data access request triggered by the application 101, interact with a storage node 20, and send the data access request to the storage node 20. The client 102 is further configured to: receive data from the storage node, and forward the data to the application 101. It may be understood that, when the client 102 is a software program, functions of the client 102 are implemented by a processor included in the computing node 10 by running a program in a memory. The client 102 may alternatively be implemented by a hardware component located inside the computing node 10. Any client 102 in the computing node cluster may access any storage node 20 in the storage node cluster.

The storage node cluster includes one or more storage nodes 20 (FIG. 1 shows three storage nodes 20, but there are not limited to the three storage nodes 20), and the storage nodes 20 may be interconnected. The storage node is a server, a desktop computer, a controller or a disk enclosure in a storage array, or the like. In terms of functions, the storage node 20 is mainly configured to perform calculation, processing, or the like on data.

In terms of hardware, as shown in FIG. 1, the storage node 20 includes at least a processor, a memory, and a network interface card.

The processor is a central processing unit (CPU), and is configured to process data from the outside of the storage node 20 or data generated inside the storage node 20.

Figure 2:
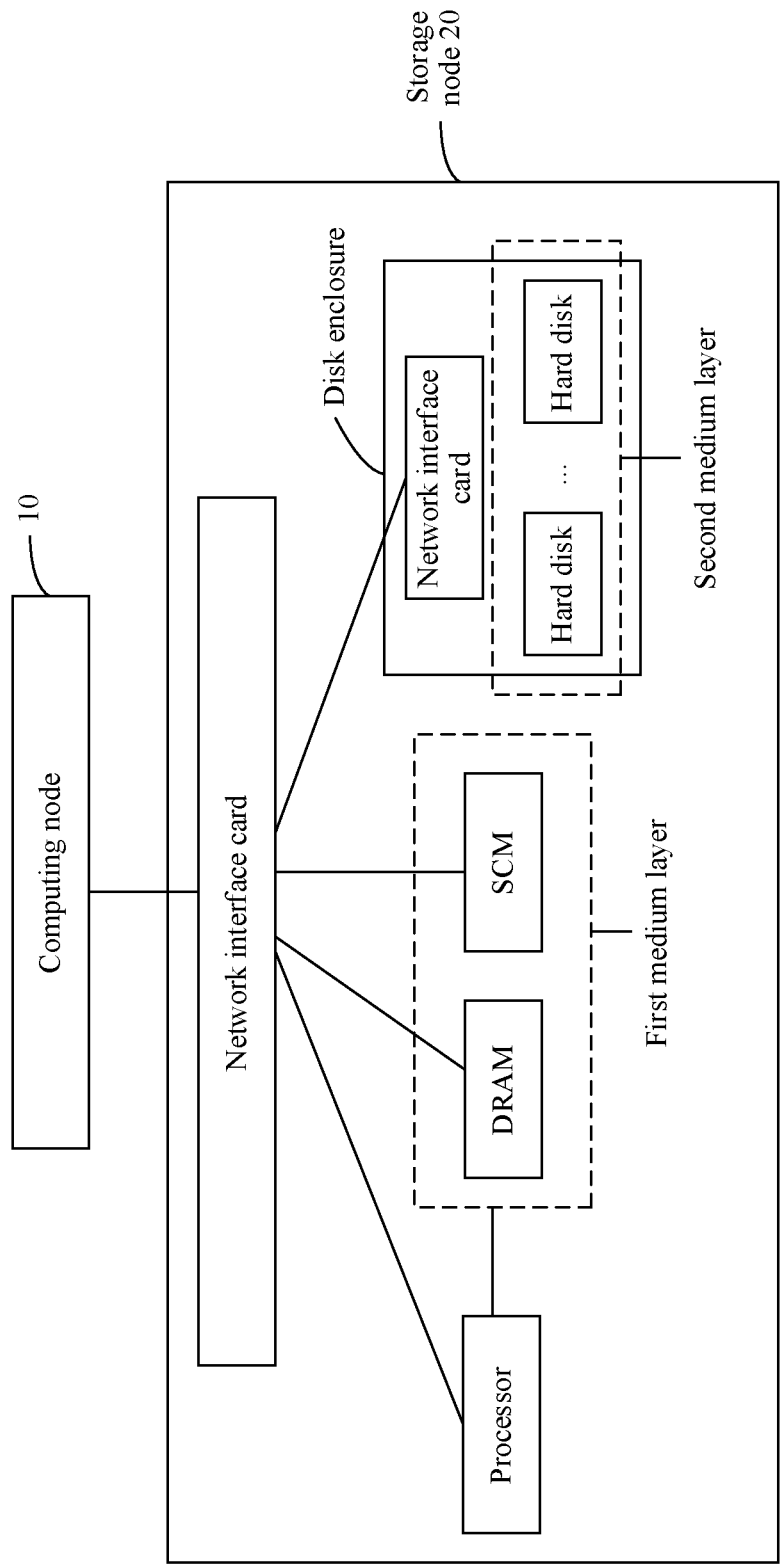
FIG. 2 is a diagram of an architecture of another storage system according to an embodiment of this disclosure.

The memory is an apparatus configured to store data. In this embodiment of this disclosure, the memory includes a memory and a hard disk. The memory is an internal memory that directly exchanges data with the processor. The memory can read/write the data at a fast speed at any time, and serves as a temporary data memory in an operating system or another running program. The memory includes one or more types of memories. For example, the memory may be a random access memory or a read-only memory (ROM). For example, the random access memory may be a dynamic random access memory (DRAM) or a storage class memory (SCM). The DRAM is a semiconductor memory, and is a volatile memory device like most random access memories (RAMs). The SCM is a composite storage technology that combines both a conventional storage apparatus feature and a memory feature. The SCM can provide a faster read/write speed than the hard disk, but is slower than the DRAM in terms of a calculation speed and cheaper than the DRAM in terms of costs. It should be noted that the processor may directly access the memory. For example, as shown in FIG. 2, the processor may directly access the DRAM and the SCM.

However, the DRAM and the SCM are merely examples for description in this embodiment. In some possible cases, the memory may include only one of the DRAM and the SCM. Alternatively, the memory may include another random access memory, for example, a static random access memory (SRAM). For example, the read-only memory may be a programmable read-only memory (PROM) or an erasable programmable read-only memory (EPROM). In addition, the memory may alternatively be a dual in-line memory module (DIMM), that is, a module including the dynamic random access memory (DRAM). In the following embodiments, an example in which the memory includes one type of memory is used for description. However, this does not constitute a limitation on a quantity of types of memories included in the memory.

The hard disk is slower than the memory in terms of a data read/write speed, and is usually configured to persistently store data. A storage node 20a is used as an example. One or more hard disks are disposed inside the storage node 20a. Alternatively, one disk enclosure (as shown in FIG. 2) is mounted outside the storage node 20, and a plurality of hard disks are disposed in the disk enclosure. In any deployment manner, these hard disks may be considered as hard disks included in the storage node 20. The hard disk herein may be a physical hard disk, or may be a logical domain or a fault domain including a plurality of physical hard disks. This is not limited in this embodiment of this disclosure. In addition, the physical hard disk is a solid state disk, a mechanical hard disk, or another type of hard disk.

It should be noted that the memory and the hard disk included in the memory are two completely different storage media, and performance of the two storage media is completely different. Compared with the hard disk, the memory has a faster data read speed and a lower latency. To be specific, performance of the memory is higher than performance of the hard disk. Based on this, in this embodiment of this disclosure, as shown in FIG. 1 and FIG. 2, the memory in each storage node 20 is referred to as a first medium layer, and the hard disk in each storage node 20 is referred to as a second medium layer. Performance of the first medium layer is higher than performance of the second medium layer. Certainly, the memory in each storage node 20 may alternatively be referred to as a second medium layer, and the hard disk in each storage node 20 may be referred to as a first medium layer. In this case, performance of the first medium layer is lower than performance of the second medium layer. Optionally, when the memory includes a plurality of storage media with different performance, each storage medium in the memory may alternatively be used as a medium layer. For example, in FIG. 1 and FIG. 2, the DRAM in each storage node forms a medium layer, the SCM in each storage node forms a medium layer, and the hard disk in each storage node forms a medium layer. Optionally, in some possible cases, the first medium layer may be a solid state disk (SSD), and the second medium layer may be a hard disk drive (HDD). In the following embodiments, descriptions are provided by using an example in which the memory includes one storage medium, the storage medium in the memory in each storage node is used as the first medium layer, and the hard disk is used as the second medium layer.

The network interface card is configured to communicate with another storage node, or is configured to communicate with a disk enclosure coupled to the storage node. In addition, the network interface card may directly access the memory in the storage node. As shown in FIG. 2, the network interface card may directly access the DRAM and the SCM.

Figure 3:
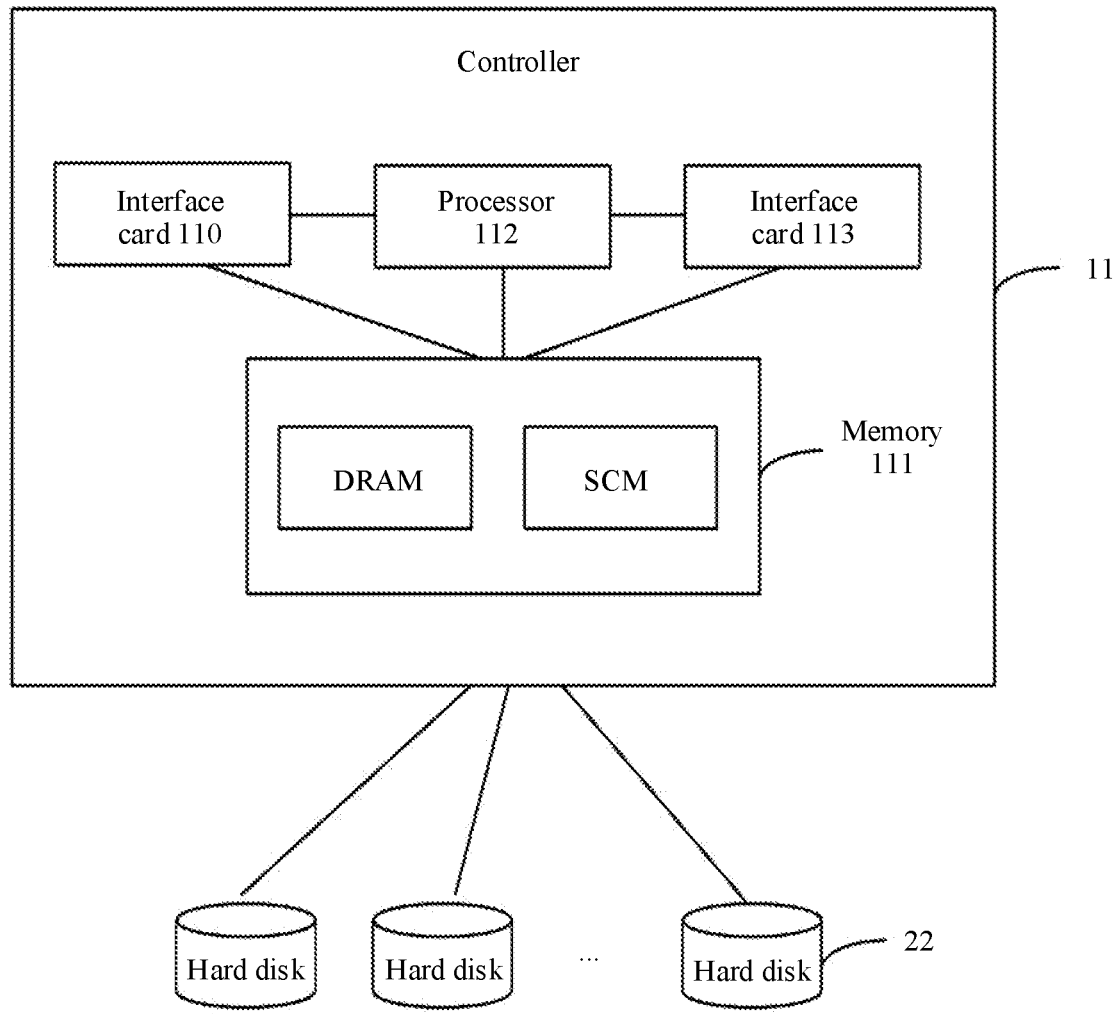
FIG. 3 is a diagram of an architecture of a storage system according to an embodiment of this disclosure.

FIG. 3 is a schematic diagram of a structure of another storage system according to an embodiment of this disclosure. The storage system shown in FIG. 3 is a storage array, and the storage array includes at least one controller (a controller 11 shown in FIG. 3) and a plurality of hard disks 22. The controller 11 is connected to a host (not shown in the figure) through a storage area network (SAN). The controller 11 may be a computing device such as a server or a desktop computer. An operating system and an application program are installed on the controller 11. The controller 11 may receive an input/output (I/O) request from the host. The controller 11 may further store data (if exists) carried in the I/O request, and write the data to the hard disk 22. The hard disk 22 is a mechanical hard disk or a solid state disk. The solid state disk is a memory that uses a flash memory chip as a medium, and is also referred to as a solid state drive (SSD).

FIG. 3 is merely used as an example for description. In actual application, the storage array may include two or more controllers. A physical structure and functions of each controller are similar to those of the controller 11. In addition, a manner of connection between the controllers and a manner of connection between any controller and the hard disk 22 are not limited in this embodiment, provided that the controllers can communicate with each other and each controller and the hard disk 22 can communicate with each other. In addition, in this embodiment, the hard disk may be a physical hard disk, or may be a logical domain or a fault domain including a plurality of physical hard disks. This is not limited in this embodiment of this disclosure.

As shown in FIG. 3, the controller 11 includes an interface card 110, a processor 112, and an interface card 113.

The interface card 110 is configured to communicate with the host, and the controller 11 receives an operation instruction of the host through the interface card 110. The processor 112 may be a central processing unit (CPU). In this embodiment of this disclosure, the processor 112 is configured to: receive an I/O request from the host and process the I/O request. The I/O request is a data write request or a data read request. The processor 112 may further send data in the data write request to the hard disk 22. The interface card 113 is configured to communicate with the hard disk 22, and the controller 11 may send, through the interface card 113, the data write request (including the data, a logical address of the data, and a virtual address of the data) to the hard disk 22 for storage.

Optionally, the controller 11 further includes a memory 111. The memory 111 is configured to temporarily store data received from the host or data read from the hard disk 22. When receiving a plurality of data write requests sent by the host, the controller 11 may temporarily store, in the memory 111, data in the plurality of data write requests. When a capacity of the memory 111 reaches a specific threshold, the data stored in the memory 111, a virtual address of the data, and a logical address assigned to the data are sent to the hard disk 22. The hard disk 22 stores the received data. The memory 111 includes a volatile memory, a flash memory chip, or a combination thereof. The volatile memory is, for example, a random access memory (RAM). The flash memory chip is any machine-readable medium that can store program code, such as a floppy disk, a hard disk, or an optical disc. The memory 111 has a power protection function. The power protection function means that the data stored in the memory 111 is not lost when the system is powered off and then powered on again.

It should be noted that the memory 111 included in the controller 11 and the hard disk 22 are two different storage media. Compared with the hard disk, the memory has a faster data read speed and a lower latency. To be specific, performance of the memory is higher than performance of the hard disk. In this embodiment of this disclosure, the memory 111 with higher performance is referred to as a first medium layer, and the plurality of hard disks 22 with lower performance than the memory are referred to as a second medium layer. In other words, performance of the first medium layer is higher than performance of the second medium layer. Alternatively, the memory 111 with higher performance is referred to as a second medium layer, and the plurality of hard disks 22 with lower performance than the memory are referred to as a first medium layer. In this case, performance of the first medium layer is lower than performance of the second medium layer.

An erasure code is a data redundancy technology. Compared with a multi-copy policy, the erasure code has higher disk utilization. For example, a Reed-Solomon code is a common erasure code. In the erasure code technology, original data is mainly encoded by using an erasure code algorithm to obtain a redundant check unit, and the data and the redundant check unit are stored together, to implement fault tolerance. A basic idea of the erasure code technology is to calculate n original data elements (data units) to obtain m redundant elements (check units), where disk utilization is n/(n+m). When any m elements (including an original data element and a redundant element) in the n+m elements are faulty, the n original data elements may be recovered by using a corresponding reconstruction algorithm. A process of generating a check unit is referred to as encoding (encoding), and a process of recovering a lost data element is referred to as decoding. An erasure code ratio mentioned in this disclosure is a ratio of a quantity n of data elements to a quantity m of redundant elements. The following describes a data storage method provided in an embodiment of this disclosure.

Figure 4:
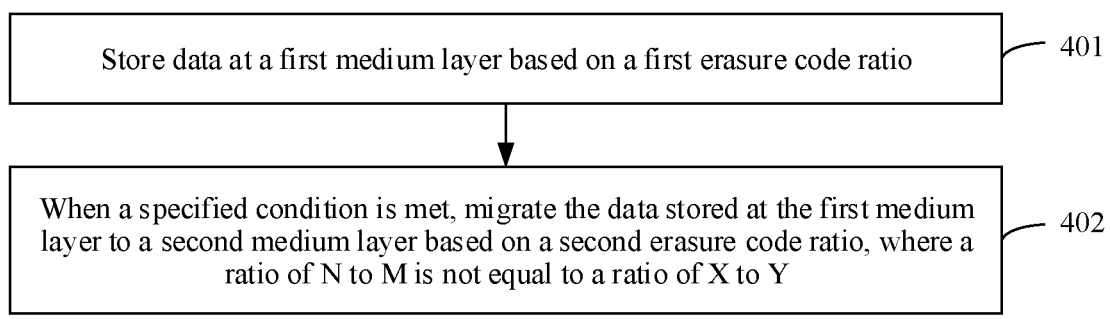
FIG. 4 is a flowchart of a data storage method according to an embodiment of this disclosure.

FIG. 4 is a flowchart of a data storage method according to an embodiment of this disclosure. The method may be applied to the storage system shown in FIG. 1 or FIG. 2, or may be applied to the storage system shown in FIG. 3. Refer to FIG. 4. The method includes the following steps.

Step 401: Store data at a first medium layer based on a first erasure code ratio.

It can be learned from the foregoing descriptions in FIG. 1 to FIG. 3 that the storage system includes a plurality of different storage media. In this embodiment of this disclosure, the data storage method is described by using an example in which the storage system includes two different storage media and performance of the first medium layer is higher than performance of a second medium layer. For example, the first medium layer is a DRAM, and the second medium layer is a hard disk. That performance of the first medium layer is higher than performance of a second medium layer means that the first medium layer has a faster read/write speed and a lower latency than the second medium layer.

In this embodiment of this disclosure, the first medium layer and the second medium layer may respectively obtain the first erasure code ratio corresponding to the first medium layer and a second erasure code ratio corresponding to the second medium layer, so that the data is stored at the first medium layer based on the first erasure code ratio, and the data is stored at the second medium layer based on the second erasure code ratio.

If the data storage method is applied to the storage system shown in FIG. 1 or FIG. 2, a management node in the storage system may obtain the first erasure code ratio and the second erasure code ratio. The management node is any one of a plurality of storage nodes in the storage system, or the management node is a node that is in the storage system, that is independent of the storage nodes, and that is configured to manage each storage node. In addition, the management node may obtain the first erasure code ratio and the second erasure code ratio during initialization, or may obtain the first erasure code ratio and the second erasure code ratio in a running process of the storage system. This is not limited in this embodiment of this disclosure. If the data storage method is applied to the storage system shown in FIG. 3, a controller in the storage system may obtain the first erasure code ratio and the second erasure code ratio. Descriptions are provided below by using an example in which the management node obtains the first erasure code ratio and the second erasure code ratio.

In a possible implementation, the management node determines the first erasure code ratio or the second erasure code ratio based on a topology structure and a fault tolerance capability of the storage system. Both the first erasure code ratio and the second erasure code ratio may be determined based on the topology structure and the fault tolerance capability of the storage system, the first erasure code ratio may be determined based on the topology structure and the fault tolerance capability of the storage system, and the second erasure code ratio may be obtained based on the first erasure code ratio, or the second erasure code ratio may be determined based on the topology structure and the fault tolerance capability of the storage system, and the first erasure code ratio may be obtained based on the second erasure code ratio. This is not limited in this embodiment of this disclosure. In addition, the topology structure is used to indicate a quantity of storage nodes included in the storage system, and the fault tolerance capability is used to indicate a quantity of storage nodes whose faults are tolerant in the storage system. The quantity of storage nodes whose faults are tolerant in the storage system is equal to a quantity of check units corresponding to the first erasure code ratio, or a quantity of check units corresponding to the second erasure code ratio.

The management node first obtains the topology structure of the storage system. For example, the management node may store the topology structure of the storage system, receive the topology structure of the storage system that is sent by another device, or receive the topology structure of the storage system that is entered by a user. The topology structure can indicate a composition of the storage system, for example, a quantity of storage nodes included in the storage system, and a quantity of subnodes included in each storage node. When the storage node is a server, the quantity of subnodes in the storage node is a quantity of physical hard disks included in the server or a quantity of disk logical domains obtained by classifying the physical hard disks included in the corresponding storage node. When the storage node is a cabinet, the quantity of subnodes in the storage node is a server included in the cabinet. One cabinet usually includes a plurality of servers.

For example, it is assumed that the storage system includes four servers, each server includes 60 physical hard disks, and every 15 physical hard disks are grouped into one disk logical domain. In this case, it can be learned from the topology structure that the storage system includes four storage nodes, and each server is one storage node. Each storage node includes four disk logical domains, that is, each storage node includes four subnodes.

In addition to obtaining the topology structure of the storage system, the management node further obtains a security level and the fault tolerance capability of the storage system. In a possible implementation, a configuration interface is displayed on the management node, and the configuration interface includes a security level configuration option and a fault tolerance capability configuration option. A user enters a required security level in the security level configuration option, and enters a quantity t of nodes on which occurrence of faults is allowed in the fault tolerance configuration option, where t is an integer greater than or equal to 1. The management node obtains the security level and the quantity t of nodes on which occurrence of faults is allowed that are entered by the user. The security level includes server-level security, cabinet-level security, and the like. The server-level security is used to indicate that the storage system can tolerate faults that occur on a maximum of t servers. The cabinet-level security is used to indicate that the storage system can tolerate faults that occur on a maximum of t cabinets. Optionally, the management node may alternatively determine the security level of the storage system based on the topology structure of the storage system according to a preset principle, where the preset principle is a calculation principle that can ensure reliability of the storage system. This is not limited in this embodiment of this disclosure. In addition, the fault tolerance capability of the storage system may alternatively be a system default value. This is not limited in this embodiment of this disclosure.

After obtaining the topology structure, the fault tolerance capability, and the security level of the storage system, the management node determines, by using the following formula (1), a value range of a quantity of data units corresponding to the first erasure code ratio.

$$N \le (k \times M) - M \quad (1)$$

Herein, N is the quantity of data units corresponding to the first erasure code ratio. k is a quantity of nodes included in the storage system. When the security level is server-level security, the node is a server. When the security level is cabinet-level security, the node is a cabinet. M is the quantity that is of nodes whose faults can be tolerant in the storage system and that is indicated by the fault tolerance capability, that is, a quantity of check units corresponding to the first erasure code ratio. It should be noted that M may be a default value, or may be a user-defined value, and M is an integer greater than or equal to 1, for example, M=2.

After determining the value range of the quantity of data units corresponding to the first erasure code ratio, the management node determines a plurality of first candidate erasure code ratios based on the value range and M, where each candidate erasure code ratio corresponds to one value in the value range. Then, the management node selects a corresponding erasure code ratio with a smallest write amplification value from the plurality of first candidate erasure code ratios as the first erasure code ratio.

Write amplification means that an amount of data actually written by a storage node is greater than an amount of data received from a computing node. In this embodiment of this disclosure, write amplification is represented by a write amplification value. For any first candidate erasure code ratio, a write amplification value corresponding to the first candidate erasure code ratio is equal to a ratio of a total quantity of data units and check units corresponding to the first candidate erasure code ratio to a quantity of data units. For example, for an erasure code ratio 6:2, the erasure code ratio is used to represent that every six data units correspond to two check units. In this way, a write amplification value corresponding to the erasure code ratio is (6+2)/6.

For example, k=4 assuming that the topology structure of the storage system indicates that the storage system includes four servers, and the security level entered by the user is server-level security. Assuming that the quantity of storage nodes whose faults can be tolerant in the storage system is 2, that is, M=2, it can be learned according to the foregoing formula (1) that the value range of the quantity of data units corresponding to the first erasure code ratio is N≤(4×2)— 2, that is, N≤6. After determining the value range of the quantity of data units corresponding to the first erasure code ratio, the management node may learn, based on the value range and a quantity of check units, that a plurality of commonly used first candidate erasure code ratios are respectively 6:2, 4:2, and 2:2. Because a write amplification value corresponding to the ratio of 6:2 in the three ratios is the smallest, the ratio of 6:2 is used as the first erasure code ratio.

In addition to the first erasure code ratio, the management node is further configured to obtain the second erasure code ratio based on the topology structure and the fault tolerance capability of the storage system. Specifically, the management node determines, by using the following formula (2), a value range of a quantity of data units corresponding to the second erasure code ratio.

$$X \le (i \times Y) - Y \quad (2)$$

Herein, X is the quantity of data units corresponding to the second erasure code ratio, and X is greater than N. i is a quantity of subnodes in a node included in the storage system. When the security level is server-level security, i is a quantity of subnodes in a server included in the storage system, where the subnode in the server may be a physical hard disk or a disk logical domain connected to the server. When the security level is cabinet-level security, i is a quantity of subnodes in a cabinet included in the storage system, where the subnode in the cabinet is a quantity of servers included in the cabinet. Y is the quantity that is of nodes whose faults can be tolerant in the storage system and that is indicated by the fault tolerance capability, that is, Y is a quantity of check units corresponding to the second erasure code ratio. It should be noted that Y may be a default value, or may be a user-defined value, and Y is greater than or equal to 1, for example, Y=2. In addition, Y may or may not be equal to M. This is not limited in this embodiment of this disclosure. It should be further noted that the security level may be configured by the user in the foregoing configuration manner. In this case, the management node directly obtains the security level configured by the user. Alternatively, the security level may be determined by the management node based on the topology structure of the storage system according to a preset principle, where the preset principle is a calculation principle that can ensure reliability of the storage system. This is not limited in this embodiment of this disclosure.

After determining the value range of the quantity of data units corresponding to the second erasure code ratio, the management node determines the second erasure code ratio based on the value range and Y.

For example, the foregoing storage system including four servers is still used as an example. Assuming that each server includes four disk logical domains, when the security level is server-level security, each server included in the storage system includes four subnodes. In this way, a total quantity of subnodes in the four servers is 16. Assuming that the quantity that is of nodes whose faults can be tolerant in the storage system and that is indicated by the fault tolerance capability is 2, that is, Y=2, and it can be learned according to the foregoing formula (2) that X≤(16×2)−2, that is, X≤30. Based on the value range, considering a system reliability constraint mechanism, the management node may select 24 data units. In this case, the second erasure code ratio is 24:2.

It can be learned from the foregoing descriptions that N in the first erasure code ratio is not equal to X in the second erasure code ratio, and N is less than X. M in the first erasure code ratio may or may not be equal to Y in the second erasure code ratio. In addition, the ratio of N to M is not equal to the ratio of X to Y.

The foregoing describes an implementation process of separately determining the first erasure code ratio and the second erasure code ratio based on the topology structure and the fault tolerance capability of the storage system. In some possible implementations, after determining the first erasure code ratio in the foregoing manner, the management node determines the second erasure code ratio X:Y based on the first erasure code ratio N:M and a preset value w. Herein, X is equal to w×N, and Y is equal to M or greater than M. Alternatively, after determining the second erasure code ratio in the foregoing manner, the management node determines the first erasure code ratio N:M based on the second erasure code ratio X:Y and a preset value w. Herein, N is equal to X/w, and M is equal to Y or less than Y.

After obtaining the first erasure code ratio and the second erasure code ratio, the management node calculates a ratio of the quantity X of data units corresponding to the second erasure code ratio to the quantity N of data units corresponding to the first erasure code ratio, where the ratio is equal to a quantity w of first check matrices included in the data stored at the first medium layer based on the first erasure code ratio. For example, when the quantity X of data units corresponding to the second erasure code ratio is equal to 24, and the quantity N of data units corresponding to the first erasure code ratio is equal to 6, the management node may determine that the quantity w of first check matrices included in the data stored at the first medium layer based on the first erasure code ratio is equal to 4. It can be learned that, in the foregoing implementation of obtaining the second erasure code ratio based on the first erasure code ratio or obtaining the first erasure code ratio based on the second erasure code ratio, the preset value w is actually the quantity of first check matrices included in the data stored at the first medium layer based on the first erasure code ratio.

After the first erasure code ratio, the second erasure code ratio, and w are obtained, when the storage node receives a data write request sent by the computing node, the storage node writes data to the first medium layer based on the first erasure code ratio and w, where the data write request includes to-be-written data. The process is described below by using an example in which a target storage node in the storage system receives the data write request sent by the computing node.

For example, the target storage node receives the data write request sent by the computing node. When a data amount of the received to-be-written data is an amount of data included in N data units, the target storage node divides the to-be-written data into the N data units, and generates M check units based on the N data units. The N data units and the M check units form one piece of subdata, the subdata corresponds to one first check matrix, and the first check matrix includes the N data units and M check units. Then, the target storage node stores, at the first medium layer in the storage system, the N data units and the M check units included in the first check matrix. In addition, the target storage node continues receiving the data write request sent by the computing node, obtains another first check matrix in the foregoing manner, and stores the first check matrix at the first medium layer. In this way, the target storage node may perform step 402 after writing, in the foregoing manner, data units and check units included in the w first check matrices to the first medium layer.

For example, the first erasure code ratio is 6:2, that is, N=6, M=2, and w=4. When the amount of to-be-written data that is sent by the computing node and that is received by the target storage node is an amount of data included in six data units, the target storage node divides the to-be-written data into the six data units, generates two check units based on the six data units, then generates a first check matrix including the six data units and two check units, and stores the eight units included in the first check matrix in a memory of each storage node in the storage system.

Specifically, the target storage node may distribute check units included in each first check matrix on a same storage node, and may distribute data units included in each first check matrix on storage nodes according to an even distribution principle.

Figure 5:
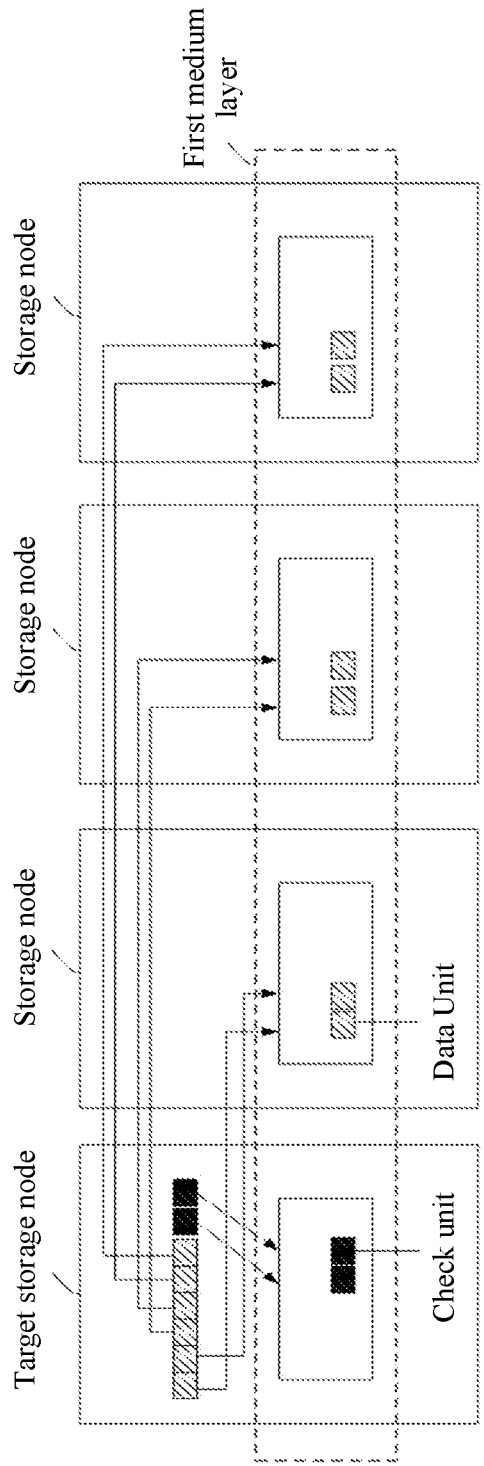
FIG. 5 is a schematic diagram of distribution of units in one first check matrix at a first medium layer according to an embodiment of this disclosure.

Refer to FIG. 5. It is assumed that storage nodes included in the storage system are four servers, and memories included in the four servers are the first medium layer. The first erasure code ratio is 6:2, that is, N=6, M=2, and w=4. Because M=2, a maximum of two of the eight units in the first check matrix are allowed to be stored in a memory of each server. Based on this, after obtaining one first check matrix, the target storage node stores two check units included in the first check matrix in a memory of the target storage node, and forwards the remaining six data units to the other three servers for storage. For example, refer to FIG. 5. Two data units are stored on each of the other three servers. In this way, after the target storage node stores the four first check matrices at the first medium layer, distribution of 32 units included in the four check matrices on the storage nodes in the storage system is shown in FIG. 6.

Figure 6:
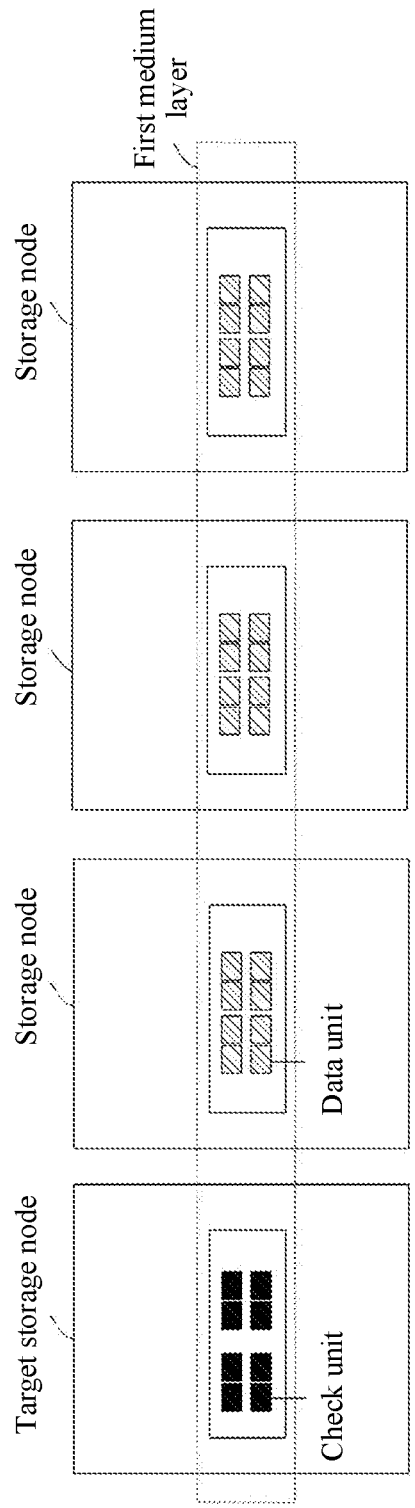
FIG. 6 is a schematic diagram of distribution of units in w first check matrices at a first medium layer according to an embodiment of this disclosure.

FIG. 5 and FIG. 6 show merely examples of possible distribution of units in the first check matrix according to this embodiment of this disclosure. Optionally, the target storage node may randomly evenly distribute a plurality of units on the storage nodes based on a maximum quantity of units allowed to be distributed on each storage node in the storage system and a quantity of units included in the first check matrix. To be specific, check units are not limited to be distributed on a same storage node. For example, in the foregoing example, one data unit and one check unit in one first check matrix may be stored in the target storage node, and the other check unit and one data unit may be stored in another storage node. In this way, the remaining four data units are evenly stored in the remaining two storage nodes. Further, when the two check units in the first check matrix are a check unit p and a check unit q, four check units p in the four first check matrices are stored in one storage node, four check units q in the four first check matrices are stored in one storage node, and the storage node on which the four check units p are located may be different from the storage node on which the four check units q are located.

The foregoing describes a process of writing the data to the first medium layer based on the first erasure code ratio when the storage system is the storage system shown in FIG. 1 or FIG. 2. Optionally, when the storage system is the storage array shown in FIG. 3, the controller in the storage array may determine the first erasure code ratio, the second erasure code ratio, and the quantity w of first check matrices included in the data stored at the first medium layer. For a determining method, refer to the foregoing described method. Details are not described herein again in this embodiment of this disclosure. After determining the first erasure code ratio, the second erasure code ratio, and w, the controller may write the data to the first medium layer based on the first erasure code ratio and w, where the first medium layer is a memory of the controller included in the storage system. It should be noted that the controller generates the w first check matrices by using the foregoing described method. Based on a quantity of controllers included in the storage system and/or a quantity of memories included in each controller, the data units and the check units included in each first check matrix are stored in the memory of each controller in a distributed manner by using the foregoing method.

Step 402: When a specified condition is met, migrate the data stored at the first medium layer to the second medium layer based on the second erasure code ratio.

When the data written to the first medium layer based on the first erasure code ratio meets the specified condition, the storage node or the controller writes the data that meets the specified condition to the second medium layer based on the second erasure code ratio. The second erasure code ratio is X:Y, that is, the data written to the second medium layer includes the X data units and the Y check units.

The specified condition includes: an available capacity of the first medium layer reaches a capacity threshold, the specified condition includes: an access frequency of the data stored at the first medium layer is less than a popularity threshold, or the specified condition includes: an end moment of a write period is reached. Certainly, the specified condition may alternatively be another condition. This is not limited in this embodiment of this disclosure. The available capacity is equal to a total capacity of the first medium layer minus a data amount of the stored data. When the available capacity of the first medium layer reaches the capacity threshold, the data at the first medium layer is migrated to the second medium layer, to help the first medium layer make space for processing more data.

This step is described below still by using an example in which the data storage method is applied to the storage system shown in FIG. 1 or FIG. 2. In the storage system, the second medium layer includes a hard disk included in a storage node in the storage system.

For example, after collecting the w first check matrices, that is, writing the data units and the check units included in the w first check matrices to the first medium layer, the target storage node obtains X data units based on N data units included in each of the w first check matrices included in the data stored at the first medium layer, where X is an integer multiple of N; obtains Y check units through calculation to generate a second check matrix, where the second check matrix includes the X data units and the Y check units; and writes the second check matrix to the second medium layer. The foregoing process may be implemented in the following several different implementations.

Implementation 1: After collecting the w first check matrices in step 401, the target storage node obtains the Y check units in the second check matrix through calculation based on w×N data units included in the w first check matrices. Then, the target storage node stores the Y check units obtained through calculation at the second medium layer. For other storage nodes, when a specified condition is met, each storage node stores, at the second medium layer, the data units that belong to the w first check matrices and that are stored in each storage node. In this way, the w×N data units stored at the second medium layer are the X data units in the second check matrix, and the Y check units obtained by the target storage node through calculation are the Y check units included in the second check matrix.

When the target storage node stores, at the second medium layer, the data units and the Y check units that are stored in the target storage node, if a quantity of hard disks included in the second medium layer is greater than a total quantity of units included in the second check matrix, the target storage node selects, based on the quantity Y of check units obtained through calculation, Y hard disks from a plurality of hard disks included in the target storage node. Then, the target storage node writes the Y check units to the selected hard disks, where one unit is written to each hard disk. Optionally, if the target storage node further stores the data units that belong to the w first check matrices, the target storage node selects one hard disk for each data unit from the hard disks included in the target storage node, and writes the data unit to the selected hard disk, where one unit is also written to each hard disk.

Optionally, if a quantity of hard disks included in the second medium layer is not greater than a total quantity of units included in the second check matrix, the storage node determines, based on the quantity of check units included in the second check matrix, a maximum quantity of units allowed to be distributed on each hard disk at the second medium layer. Then, if the target storage node further stores the data units that belong to the w first check matrices, the target storage node selects, based on the maximum quantity of units, the quantity of data units that belong to the w first check matrices and that are stored in the target storage node, and Y, a plurality of hard disks from hard disks included in the target storage node, and writes the stored data units and the check units to the plurality of selected hard disks. Certainly, if the target storage node does not store the data units that belong to the w first check matrices, the target storage node selects, based on the maximum quantity of units and Y, a plurality of hard disks from hard disks included in the target storage node, and writes the Y check units to the selected hard disks. In this case, a plurality of units in the second check matrix may be stored on one hard disk, but a quantity of stored units does not exceed a maximum quantity of units allowed to be distributed on the hard disk. A storage node other than the target storage node may write, to the second medium layer by using the foregoing method, the data units that belong to the w first check matrices and that are stored in the storage node.

Figure 7:
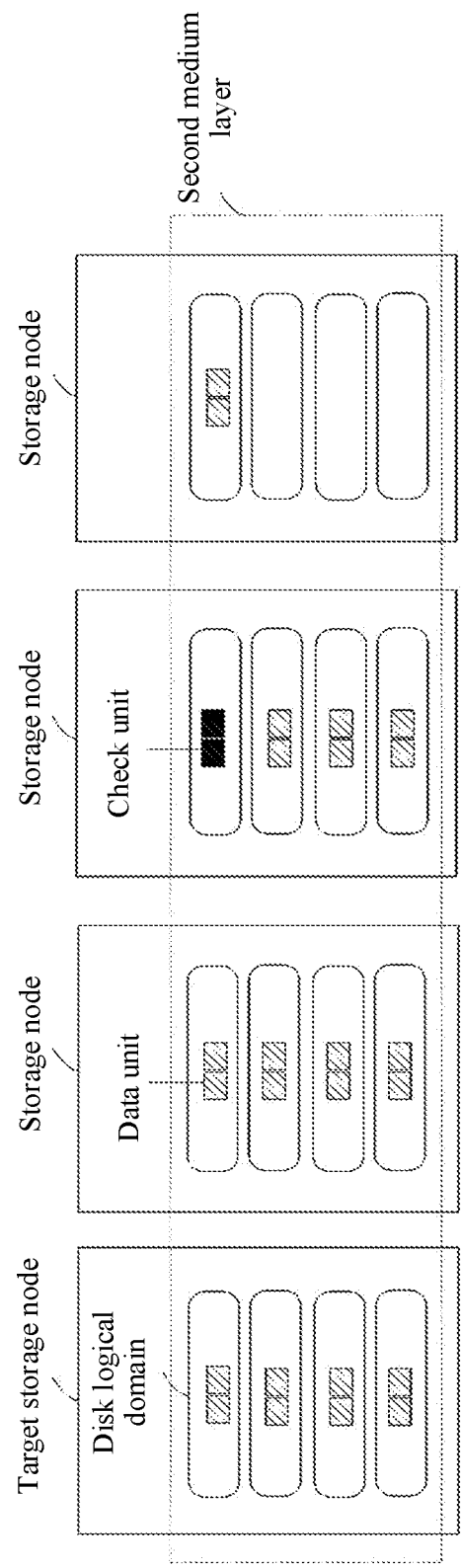
FIG. 7 is a schematic diagram of distribution of units in a second check matrix at a second medium layer according to an embodiment of this disclosure.

For example, refer to FIG. 7. It is assumed that the second medium layer includes 16 disk logical domains, the 16 disk logical domains belong to four storage nodes, the w first check matrices include a total of 24 data units, that is, a quantity of data units included in the second check matrix is 24, and a quantity of check units obtained by the target storage node through calculation is 2. Because a quantity of check units included in the second check matrix is 2, it can be learned that a maximum quantity of units allowed to be distributed on each disk logical domain is 2. In this way, when each storage node stores the 24 data units and the two check units at the second medium layer in the foregoing described manner, two units are stored in each disk logical domain of each of three storage nodes in the four storage nodes, that is, a total of eight units are stored in each storage node, and two units may be stored on one disk logical domain of another storage node, or one unit may be stored on each of two disk logical domains of another storage node.

Implementation 2: After collecting the w first check matrices, the target storage node obtains the Y check units in the second check matrix based on w×M check units included in the w first check matrices. Then, the target storage node stores the Y check units obtained through calculation at the second medium layer. For other storage nodes, when an amount of data in a cache of each storage node reaches a specific threshold, each storage node stores, at the second medium layer, the data units that belong to the w first check matrices and that are stored in each storage node.

The following several different cases are separately described in Implementation 2.

(1) When all the check units included in the w first check matrices are stored in the target storage node, the target storage node obtains the w×M check units stored in the target storage node, and obtains the Y check units based on the w×M check units.

For example, when the M check units included in each first check matrix are respectively a check unit p and a check unit q, the target storage node performs an exclusive OR operation or another calculation manner on stored w check units p to obtain a check unit p' in the second check matrix, and performs an exclusive OR operation or another calculation manner on stored w check units q to obtain a check unit q' in the second check matrix. It can be learned that, in this embodiment of this disclosure, the target storage node can obtain the check units in the second check matrix by directly calculating the M check units included in each first check matrix. Compared with calculating the check units based on all the data units in the w first check matrices, this manner reduces a calculation amount. In addition, because all the check units in each first check matrix are stored in a same storage node, the storage node can directly obtain the stored check units to obtain the check units in the second check matrix. Compared with a case in which the check units are stored in the storage nodes in a distributed manner, in this case, the check units are obtained without crossing the storage node, to reduce a network forwarding amount.

After obtaining the Y check units through calculation, the target storage node stores the Y check units at the second medium layer by using the method described in the foregoing first embodiment, or stores, at the second medium layer, the data units belonging to the w first check matrices and the Y check units that are stored in the target storage node. After the specified condition is met, another storage node stores data units stored in the another storage node at the second medium layer. In this way, the w first check matrices stored in each storage node are combined to form the second check matrix and stored at the second medium layer.

Figure 8:
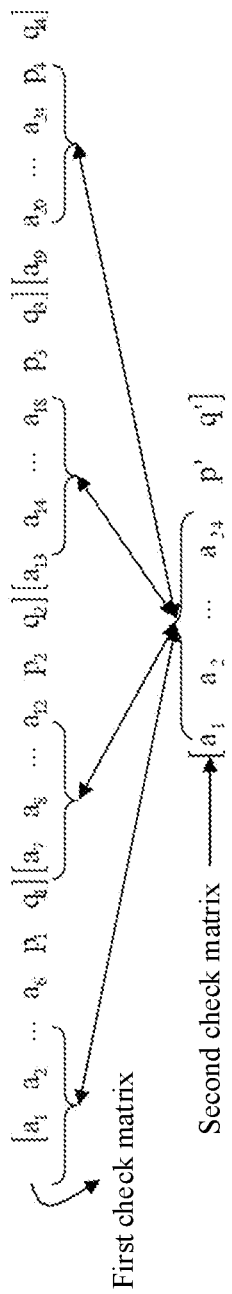
FIG. 8 is a schematic diagram of a principle of combining w first check matrices to obtain a second check matrix according to an embodiment of this disclosure.

FIG. 8 is a schematic diagram of a principle of combining w first check matrices to obtain a second check matrix according to an embodiment of this disclosure. As shown in FIG. 8, w=4, the first six elements $a_1$ to $a_6$ in the $1^{st}$ first check matrix are six data units, and the remaining two elements $p_1$ and $q_1$ are two check units. Herein, $p_1$ is a check unit p, and $q_1$ is a check unit q. Similarly, $a_7$ to $a_{12}$ in the $2^{nd}$ first check matrix are six data units, and the remaining two elements $p_2$ and $q_2$ are two check units, and so on. The first six elements in each check matrix are extracted to form 24 data units in the second check matrix. Check units p (that is, $p_1$ to $p_4$) in all the first check matrices are extracted, and an exclusive OR operation or another calculation manner is performed to obtain a check unit p' in the second check matrix. Check units q (that is, $q_1$ to $q_4$) in all the first check matrices are extracted, and an exclusive OR operation or another calculation manner is performed to obtain a check unit q' in the second check matrix.

It should be noted that FIG. 8 describes an example of a process of combining the w first check matrices to form the second check matrix. In some possible application scenarios, for example, when performance of a first medium layer is lower than performance of a second medium layer, the second check matrix may need to be split into the w first check matrices in a process of reading data at the first medium layer into the second medium layer. In this case, the w first check matrices can be obtained only by reversely performing the foregoing process. This is not limited in this embodiment of this disclosure.

Optionally, when M check units included in each first check matrix are check units r, the target storage node performs incremental calculation such as an exclusive OR operation on the stored w check units r to obtain a check unit r' in the second check matrix, and then the target storage node may obtain data units that are in all the first check matrices and that are stored in the target storage node and other storage nodes, and obtains a check unit p' and a check unit q' through calculation based on the obtained w×N data units. The target storage node uses the check unit r', the check unit p', and the check unit q' that are obtained through calculation as Y check units in the second check matrix. It can be learned that, in this implementation, Y is not equal to M. In addition, a process of calculating the check unit r' based on the data units is complex. Therefore, in this embodiment of this disclosure, the check unit r' in the second check matrix is obtained by performing incremental calculation on the check units r in all the first check matrices, to reduce computation overheads. In addition, the check unit p' and the check unit q' are obtained through calculation based on the w×N data units, so that the second check matrix includes three check units, to improve redundancy of data stored at the second medium layer, and improve a fault tolerance capability.

Figure 9:
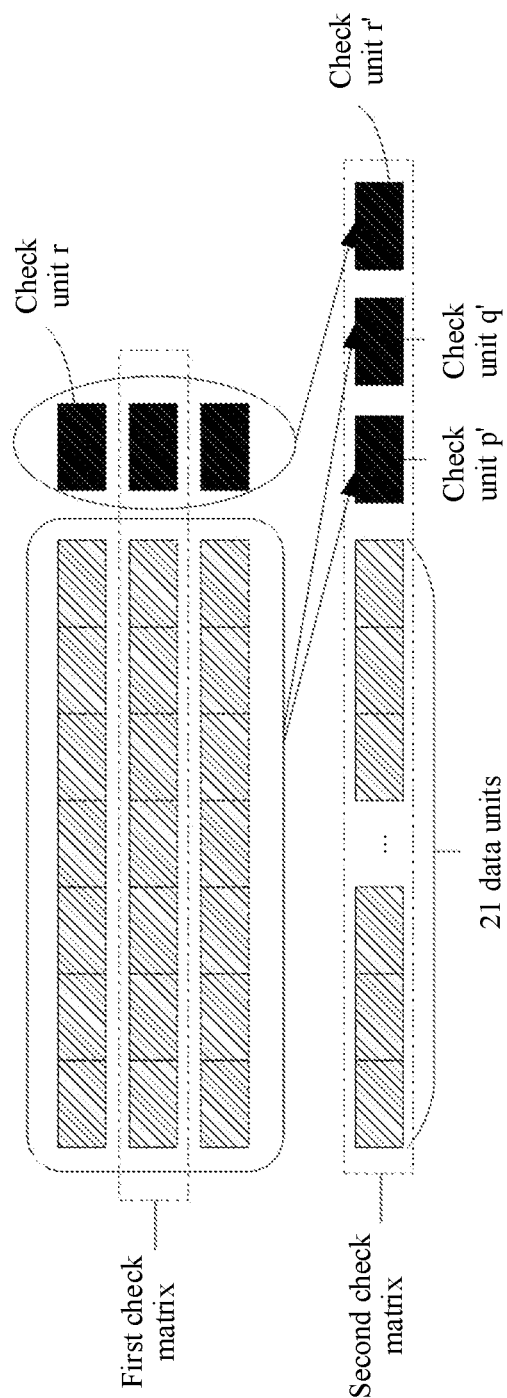
FIG. 9 is a schematic diagram of obtaining check units in a second check matrix according to an embodiment of this disclosure.

For example, refer to FIG. 9. It is assumed that there are three first check matrices, and each first check matrix includes seven data units and one check unit r. The target storage node performs an exclusive OR operation on stored three check units r to obtain a check unit r' in the second check matrix. Then, the target storage node obtains 21 data units stored in the target storage node and other storage nodes, and obtains a check unit p' and a check unit q' through calculation based on the 21 data units. In this way, Y check units included in the second check matrix are the generated check unit p', check unit q', and check unit r'. It can be learned that, in this implementation, redundancy of data stored at the second medium layer can be improved, so that a fault tolerance capability can be improved, and some computation overheads can also be reduced.

After obtaining the Y check units through calculation, the target storage node also stores the stored data units and the Y check units at the second medium layer by using the method described in Implementation 1, and after an amount of data in a cache of another storage node reaches a specific threshold, the another storage node stores, at the second medium layer, data units stored in the another storage node. Details are not described herein again in this embodiment of this disclosure.

(2) When the M check units included in each first check matrix are stored in different storage nodes in a distributed manner, the target storage node obtains the stored check units from each storage node, and obtains the Y check units based on the obtained w×M check units. For an implementation in which the target storage node obtains the Y check units based on the obtained w×M check units, refer to the implementation in Case (1). Details are not described again in this embodiment of this disclosure. After obtaining the Y check units, the target storage node stores the stored data units and the Y check units at the second medium layer by using the method described in Implementation 1, and after an amount of data in a cache of another storage node reaches a specific threshold, the another storage node stores, at the second medium layer, data units stored in the another storage node. Details are not described herein again in this embodiment of this disclosure.

Implementation 3: After collecting the w first check matrices, the target storage node writes, to the second medium layer, units that belong to the w first check matrices and that are stored in the target storage node, and after an amount of data stored in a cache of another storage node reaches a specific threshold, the another storage node also writes, to the second medium layer, units that belong to the w first check matrices and that are stored in the another storage node. Then, the target storage node obtains the w×M check units written to the second medium layer, obtains the Y check units through calculation based on the w×M check units, and uses the Y check units obtained through calculation as the Y check units in the second check matrix and writes the Y check units to the second medium layer.

If a quantity of hard disks included in the second medium layer is greater than a total quantity of units included in the second check matrix, when writing, to the second medium layer, data units belonging to the w first check matrices and the check units that are stored in each storage node, each storage node may select one hard disk for each data unit, and write each data unit to the hard disk selected for the corresponding data unit, where different hard disks are also selected for different data units. In this way, X data units included in the second check matrix are to be written to X hard disks. For the check units in the w first check matrices, each storage node may store, on a hard disk other than the X hard disks, check units stored in each storage node.

It should be noted that, when the check units are written, one check unit may be written to each hard disk. In this way, w×M check units are to be written to w×M hard disks. Alternatively, all check units may be written to one hard disk. Alternatively, w×M check units may be written to M hard disks, and check units written to each of the M hard disks are check units located in a same column in the first check matrix. For example, when M=2, one of the two check units is a check unit p, and the other check unit is a check unit q. In this case, the check unit p in each first check matrix is written to one hard disk, and the check unit q is written to the other hard disk.

After each storage node writes, to the second medium layer, the data units belonging to the w first check matrices and the check units that are stored in each storage node, the target storage node obtains the w×M check units from the second medium layer. If the w×M check units are to be written to the w×M hard disks, the target storage node reads the w×M check units from the w×M hard disks. If all the check units are written to one hard disk, the target storage node obtains the w×M check units from the hard disk at a time. In this way, a quantity of network communication times can be reduced, and bandwidth resources can be saved. If the w×M check units are written to the M hard disks, and check units written to each of the M hard disks are the check units located in the same column in the first check matrix, the target storage node reads the check units located in the same column from each hard disk, to obtain the w×M check units. In this way, a quantity of network communication times can also be reduced to some extent, and bandwidth resources can be saved.

After obtaining the w×M check units, the target storage node obtains the Y check units through calculation based on the w×M check units by using the method described in Implementation 1, and respectively writes the Y check units to Y hard disks, where one check unit is written to each hard disk, and the Y hard disks to which the Y check units are written are not hard disks in the X hard disks to which the data units are written.

Optionally, if a quantity of hard disks included in the second medium layer is not greater than a total quantity of units included in the second check matrix, each storage node may write two or more units to one hard disk by using the method described in Implementation 1, provided that a maximum quantity of units allowed to be stored is not exceeded. Similarly, in this case, the M check units included in each first check matrix may be stored on hard disks of a same storage node, or check units that are located in a same column and that are in the M check units included in each first check matrix may be stored on a hard disk of one storage node, for example, stored on a same disk logical domain of one storage node, or stored on one physical hard disk of one storage node, to reduce a quantity of network forwarding times required when the Y check units in the second check matrix are calculated.

Figure 10:
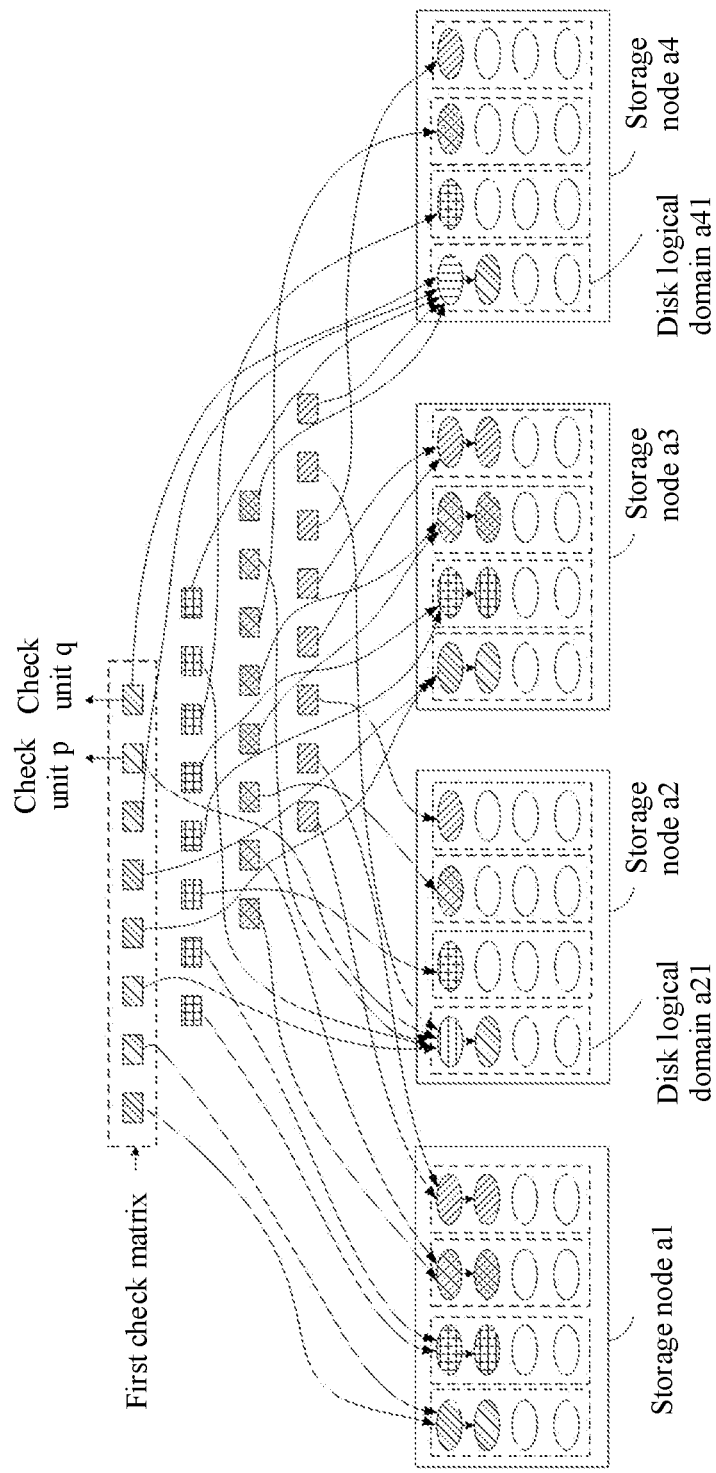
FIG. 10 is a schematic diagram of writing data to a second medium layer based on a second erasure code ratio according to an embodiment of this disclosure.

For example, FIG. 10 is a schematic diagram of writing data to a second medium layer based on a second erasure code ratio according to an embodiment of this disclosure. As shown in FIG. 10, a quantity w of first check matrices is equal to 4, and each first check matrix includes six data units and two check units. The two check units are respectively a check unit p and a check unit q. The second medium layer includes 16 disk logical domains distributed on four storage nodes ($a_1$ to $a_4$), four disk logical domains are distributed on each storage node, and each disk logical domain includes 16 physical hard disks. Because a quantity of check units is 2, a maximum of two units in the second check matrix are allowed to be distributed in each disk logical domain. Based on this, two disk logical domains are first selected from the 16 disk logical domains. For example, the selected two disk logical domains are respectively a disk logical domain a21 on the storage node a2 and a disk logical domain a41 on the storage node a4. Then, each storage node that stores check units p in all first check matrices writes the check units p stored in each storage node to a physical hard disk in the disk logical domain a21. For example, the check units p in all the first check matrices are written to the $1^{st}$ physical hard disk in the disk logical domain a21. Similarly, each storage node that stores check units q in all the first check matrices writes the check units q stored in each storage node to the $1^{st}$ physical hard disk in the disk logical domain a41. Then, for the disk logical domain a21, the target storage node or the storage node a2 performs an exclusive OR operation on the four check units p that are in the four first check matrices and that are written to the disk logical domain a21 to obtain a check unit p' in the second check matrix, and stores the check unit p' on the disk logical domain a21. Because a maximum of two units in the second check matrix are allowed to be stored on each disk logical domain, after the check unit p' that is in the second check matrix and that is obtained through calculation is written to the disk logical domain a21, a maximum of one data unit in the second check matrix can be further stored on the disk logical domain a21. Similarly, for the disk logical domain a41, the target storage node or the storage node a4 may also perform incremental calculation such as an exclusive OR operation on the four check units q stored in the target storage node or the storage node a4 to obtain a check unit q' in the second check matrix, and store the check unit q' on the disk logical domain a41. In this way, only a maximum of one data unit in the second check matrix can also be stored on the disk logical domain a41. Then, for the six data units included in each first check matrix, each storage node distributes, according to a principle that a maximum of two units in the second check matrix are distributed on each disk logical domain, the 24 data units on the 16 disk logical domains included in the four storage nodes.

The foregoing describes a process of writing the data to the first medium layer based on the first erasure code ratio when the storage system is the storage system shown in FIG. 1 or FIG. 2. Optionally, when the storage system is the storage array shown in FIG. 3, an operation performed by the storage node may be performed by the controller, so that the data units and the check units in the w first check matrices included in the data at the first medium layer are combined to form the second check matrix and written to the second medium layer. Details are not described herein again in this embodiment of this disclosure.

After the data is stored according to the foregoing data storage method, when a node included in the first medium layer or a hard disk included in the second medium layer is faulty, if the data is stored at the second medium layer, that is, the second check matrix is generated, a data unit and a check unit at a location other than a fault point are read from the second medium layer for reconstruction based on a quantity of fault points, a fault location, and a distribution location of each unit in the second check matrix, to recover the data at the fault point. Optionally, if the data is stored at the first medium layer but is not stored at the second medium layer, a data unit and a check unit at a location at which a fault does not occur are read from the first medium layer for reconstruction based on a quantity of fault points, a fault location, and a distribution location of each unit in the first check matrix, to recover data at a fault point at the first medium layer.

In this embodiment of this disclosure, a quantity of data units corresponding to the first erasure code ratio is less than a quantity of data units corresponding to the second erasure code ratio, that is, the first erasure code ratio is a ratio of a low proportion, and the second erasure code ratio is a ratio of a high proportion. Based on this, the data is stored at the first medium layer based on the first erasure code ratio, the data is stored at the second medium layer based on the second erasure code ratio, and the performance of the first medium layer is higher than the performance of the second medium layer. To be specific, data is stored at a high-performance medium layer based on a low erasure code ratio, and data is stored at a low-performance medium layer based on a high erasure code ratio. Because an I/O granularity received at the high-performance medium layer is small, when the data is stored at the high-performance medium layer based on the low erasure code ratio, each time an amount of the received data is an amount of data included in the N data units corresponding to the erasure code ratio, a full strip can be completed (the N data units and the M check units may form a stripe). Compared with the high erasure code ratio, the low erasure code ratio is more likely to complete the full stripe, so that an amount of data that is padded with 0 in the stripe is reduced, write amplification is reduced, and storage space utilization is improved. For example, compared with storing the data based on 24:2, in a case in which the data is stored at the high-performance medium layer based on an erasure code ratio of 6:2, in a specified time period, based on an I/O request at the received small granularity, it is easier to collect six data units than to collect 24 data units. In this way, 0 does not need to be padded with when the 24 data units cannot be collected, that is, an amount of data that is padded with 0 in the stripe is reduced, a proportion of an amount of redundant data in the stripe is reduced, write amplification is reduced, and storage space utilization is improved. In addition, the data is stored at the low-performance medium layer based on the high erasure code ratio, so that a proportion of redundant data in storage space can be reduced, to improve storage space utilization.

In this embodiment of this disclosure, a piece of data stored at the first medium layer based on the first erasure code ratio can be directly converted into a piece of data that meets the second erasure code ratio, and stored at the second medium layer, that is, data at different medium layers can be converted to each other through calculation, so that computing resources of the storage system are saved.

The foregoing embodiment mainly describes an implementation process of writing the data from the first medium layer to the second medium layer when the performance of the first medium layer is higher than the performance of the second medium layer. When the performance of the first medium layer is lower than the performance of the second medium layer, migrating the data stored at the first medium layer to the second medium layer is a data reading process. In this case, N in the first erasure code ratio is greater than X in the second erasure code ratio. Correspondingly, the reading process is an inverse process of the foregoing writing process. Details are not described herein again in this embodiment of this disclosure.

The following describes a data storage apparatus provided in an embodiment of this disclosure.

Figure 11:
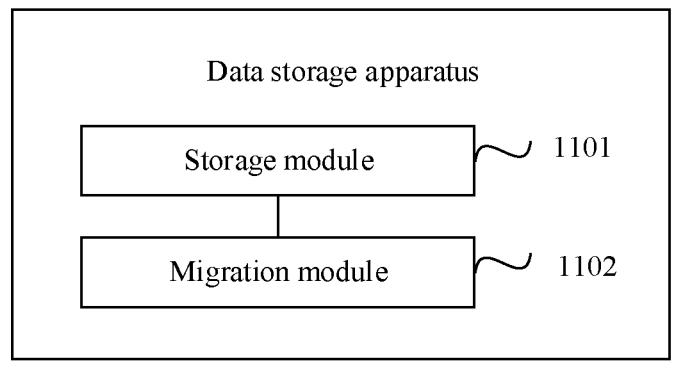
FIG. 11 is a schematic diagram of a structure of a data storage apparatus according to an embodiment of this disclosure.

Refer to FIG. 11. An embodiment of this disclosure provides a data storage apparatus. The apparatus is applied to the foregoing storage device. The storage device may be any storage node in the storage system shown in FIG. 1 or FIG. 2, or may be the storage array shown in FIG. 3. The storage device includes the first medium layer and the second medium layer described above, and performance of the first medium layer is different from performance of the second medium layer. The apparatus includes a storage module 1101 and a migration module 1102.

The storage module 1101 is configured to: receive data, and store the data at the first medium layer based on a first erasure code ratio. For details, refer to step 401 in the foregoing embodiment.

The migration module 1102 is configured to: when a specified condition is met, obtain the data from the first medium layer, and migrate the data to the second medium layer based on a second erasure code ratio, where the first erasure code ratio corresponds to N data units and M check units, and N and M are integers greater than or equal to 1; the second erasure code ratio corresponds to X data units and Y check units, and X and Y are integers greater than or equal to 1; and a ratio of N to M is not equal to a ratio of X to Y. For details, refer to step 402 in the foregoing embodiment. The storage module 1101 and the migration module 1102 may be implemented by a processor in the storage device by running program instructions in a memory.

Optionally, the performance of the first medium layer is higher than the performance of the second medium layer, and the ratio of N to M is less than the ratio of X to Y.

Optionally, the data stored at the first medium layer includes a plurality of pieces of subdata, each subdata corresponds to one first check matrix, and each first check matrix includes the N data units and the M check units.

Optionally, the migration module 1102 is specifically configured to:

obtain the X data units based on the N data units included in each first check matrix, where X is an integer multiple of N;

obtain the Y check units through calculation to generate a second check matrix, where the second check matrix includes the X data units and the Y check units; and write the second check matrix to the second medium layer.

Optionally, that the Y check units are obtained through calculation includes: obtaining the Y check units through calculation based on the X data units.

Optionally, the migration module is further specifically configured to calculate the Y check units based on the M check units included in each first check matrix, where Y is equal to M.

Optionally, the M check units in each first check matrix are stored in a first storage node in the storage system, and the apparatus is further configured to obtain the M check units in each first check matrix from the first storage node.

Optionally, when M is greater than or equal to 2, the M check units include a check unit p and a check unit q, where the check unit p in each first check matrix is stored in a first storage node in the storage system, and the check unit q in each first check matrix is stored in a second storage node in the storage system. The apparatus is further configured to:

obtain the check unit p in each first check matrix from the first storage node; and obtain the check unit q in each first check matrix from the second storage node.

That the Y check units are calculated based on the M check units included in each first check matrix specifically includes: obtaining the Y check units through calculation based on the check unit p in each first check matrix and the check unit q in each first check matrix, where the Y check units include a check unit p' and a check unit q' in the check matrix.

Optionally, the apparatus is further configured to determine the first erasure code ratio or the second erasure code ratio based on a topology structure of the storage system and a fault tolerance capability of the storage system, where the topology structure is used to indicate a quantity of storage nodes included in the storage system, and the fault tolerance capability is used to indicate a quantity of storage nodes whose faults are tolerant in the storage system.

Optionally, the specified condition includes: an available capacity of the first medium layer reaches a capacity threshold.

Optionally, the specified condition includes: an access frequency of the data stored at the first medium layer is less than a popularity threshold.

In conclusion, in this embodiment of this disclosure, the performance of the first medium layer is different from the performance of the second medium layer. Based on this, data is stored at the first medium layer and the second medium layer based on different erasure code ratios. The different erasure code ratios correspond to different write amplification, and therefore storage space utilization is different. Therefore, different erasure code ratios are selected based on different performance of medium layers to store data, so that storage performance of a corresponding medium layer can be better achieved, to effectively improve storage space utilization.

It should be noted that, when the data storage apparatus provided in the foregoing embodiment stores data, only division into the foregoing functional modules is used as an example for description. In actual application, the foregoing functions may be allocated to different functional modules for implementation based on a requirement, that is, an internal structure of a device is divided into different functional modules, to complete all or some of the functions described above. In addition, the data storage apparatus provided in the foregoing embodiment and the data storage method embodiments pertain to a same concept. For a specific implementation process of the data storage apparatus, refer to the method embodiments. Details are not described herein again.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer instructions are loaded and executed on a computer, the procedures or functions according to the embodiments of this disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a web site, computer, server, or data center to another web site, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid state disk (SSD)), or the like.

A person of ordinary skill in the art may understand that all or some of the steps in the embodiments may be implemented by hardware or a program instructing related hardware. The program may be stored in a computer-readable storage medium. The storage medium may be a read-only memory, a magnetic disk, an optical disc, or the like.

It should be understood that "at least one" mentioned in this specification means one or more, and "a plurality of" means two or more. In descriptions of this specification, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, for ease of clearly describing the technical solutions in the embodiments of this disclosure, in the embodiments of this disclosure, terms such as "first" and "second" are used to distinguish same items or similar items whose functions and functions are basically the same. A person skilled in the art may understand that the terms such as "first" and "second" do not limit a quantity or an execution sequence, and the terms such as "first" and "second" do not indicate a definite difference.

What is claimed is:

1. A data storage method performed in a storage system, comprising:
    determining, based on a topology structure of the storage system and a fault tolerance capability of the storage system, a first erasure code ratio for a first medium layer of the storage system or a second erasure code ratio for a second medium layer of the storage system, wherein the topology structure indicates a quantity of storage nodes comprised in the storage system, and the fault tolerance capability indicates a quantity of storage nodes whose faults are tolerant in the storage system;
    storing data in the first medium layer based on the first erasure code ratio; and
    when a specified condition is met, migrating the data stored at the first medium layer to the second medium layer based on the second erasure code ratio, wherein performance of the first medium layer is different from performance of the second medium layer, the first erasure code ratio corresponds to N data units and M check units, the second erasure code ratio corresponds to X data units and Y check units, and a ratio of N to M is not equal to a ratio of X to Y.

2. The method according to claim 1, wherein the performance of the first medium layer is higher than the performance of the second medium layer, and N is less than X.

3. The method according to claim 2, wherein the data stored at the first medium layer comprises a plurality of pieces of subdata, each subdata corresponds to one first check matrix, and each first check matrix comprises the N data units and the M check units, and wherein the step of migrating the data stored at the first medium layer to the second medium layer based on a second erasure code ratio comprises:
    obtaining the X data units based on the N data units comprised in each first check matrix, wherein X is an integer multiple of N;
    obtaining the Y check units through calculation to generate a second check matrix, wherein the second check matrix comprises the X data units and the Y check units; and
    writing the second check matrix to the second medium layer.

4. The method according to claim 3, wherein the step of obtaining the Y check units through calculation comprises: obtaining the Y check units through calculation based on the X data units.

5. The method according to claim 3, wherein the step of obtaining the Y check units through calculation comprises: calculating the Y check units based on the M check units comprised in each first check matrix, wherein Y is equal to M.

6. The method according to claim 5, wherein the M check units in each first check matrix are stored in a first storage node in the storage system, and wherein the method further comprises: obtaining the M check units in each first check matrix from the first storage node.

7. The method according to claim 5, wherein M is greater than or equal to 2, the M check units comprise a check unit p and a check unit q, wherein the check unit p in each first check matrix is stored in a first storage node in the storage system, and the check unit q in each first check matrix is stored in a second storage node in the storage system, and wherein the method further comprises:
    obtaining the check unit p in each first check matrix from the first storage node; and
    obtaining the check unit q in each first check matrix from the second storage node,
    wherein the step of calculating the Y check units based on the M check units comprises:
    obtaining the Y check units through calculation based on the check unit p in each first check matrix and the check unit q in each first check matrix, wherein the Y check units comprise a check unit p' and a check unit q' in the second check matrix.

8. The method according to claim 1, wherein the specified condition comprises: an available capacity of the first medium layer reaching a capacity threshold.

9. The method according to claim 1, wherein the specified condition comprises:
    an access frequency of the data stored at the first medium layer being less than a popularity threshold.

10. A storage system comprising:
    a first medium layer;
    a second medium layer, wherein performance of the first medium layer is different from performance of the second medium layer; and
    a processor configured to:
    determine a first erasure code ratio for the first medium layer or a second erasure code ratio for the second medium layer based on a topology structure of the storage system and a fault tolerance capability of the storage system, wherein the topology structure indicates a quantity of storage nodes comprised in the storage system, and the fault tolerance capability indicates a quantity of storage nodes whose faults are tolerant in the storage system;
    store data in the first medium layer based on the first erasure code ratio; and
    when a specified condition is met, migrate the data in the first medium layer to the second medium layer based on the second erasure code ratio, wherein the first erasure code ratio corresponds to N data units and M check units, the second erasure code ratio corresponds to X data units and Y check units, and a ratio of N to M is not equal to a ratio of X to Y.

11. The system according to claim 10, wherein the performance of the first medium layer is higher than the performance of the second medium layer, and N is less than X.

12. The system according to claim 11, wherein the data stored at the first medium layer comprises a plurality of pieces of subdata, each subdata corresponds to one first check matrix, and each first check matrix comprises the N data units and the M check units, wherein the processor is configured to migrate the data stored at the first medium layer to the second medium layer based on a second erasure code ratio by performing operations of:

obtaining the X data units based on the N data units comprised in each first check matrix, wherein X is an integer multiple of N;

obtaining the Y check units through calculation to generate a second check matrix, wherein the second check matrix comprises the X data units and the Y check units; and writing the second check matrix to the second medium layer.

13. The system according to claim 12, wherein the processor is configured to obtain the Y check units through calculation based on the X data units.

14. The system according to claim 12, wherein the processor is configured to obtain the Y check units through calculation based on the M check units comprised in each first check matrix, and Y is equal to M.

15. The system according to claim 14, wherein the M check units in each first check matrix are stored in a first storage node in the storage system, and the first storage node is configured to:

obtain the M check units in each first check matrix; and obtain the Y check units through calculation based on the M check units comprised in each first check matrix.

16. The system according to claim 10, wherein the specified condition comprises:

an available capacity of the first medium layer reaching a capacity threshold.

17. The system according to claim 10, wherein the specified condition comprises:

an access frequency of the data stored at the first medium layer being less than a popularity threshold.

* * * * *